(12) United States Patent
Lee et al.

(10) Patent No.: US 10,949,339 B2
(45) Date of Patent: *Mar. 16, 2021

(54) MEMORY MODULE WITH CONTROLLED BYTE-WISE BUFFERS

(71) Applicant: Netlist, Inc., Irvine, CA (US)

(72) Inventors: Hyun Lee, Ladera Ranch, CA (US); Jayesh R. Bhakta, Cerritos, CA (US)

(73) Assignee: NETLIST, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/470,856

(22) Filed: Mar. 27, 2017

(65) Prior Publication Data

US 2017/0337125 A1 Nov. 23, 2017

Related U.S. Application Data

(63) Continuation of application No. 13/970,606, filed on Aug. 20, 2013, now Pat. No. 9,606,907, which is a
(Continued)

(51) Int. Cl.
*G06F 12/00* (2006.01)
*G11C 8/12* (2006.01)
(Continued)

(52) U.S. Cl.
CPC .............. *G06F 12/00* (2013.01); *G11C 5/025* (2013.01); *G11C 5/04* (2013.01); *G11C 5/066* (2013.01); *G11C 8/12* (2013.01)

(58) Field of Classification Search
None
See application file for complete search history.

(56) References Cited

U.S. PATENT DOCUMENTS

| 4,249,253 A | 2/1981 | Gentili et al. |
| 4,571,676 A | 2/1986 | Mantellina et al. |
| (Continued) |

FOREIGN PATENT DOCUMENTS

| CN | 102576565 B | 9/2015 |
| JP | 09237492 | 9/1997 |
| (Continued) |

OTHER PUBLICATIONS

Inter Partes Review of U.S. Pat. No. 9,606,907, Case No. IPR2018-00362, Patent Owner's Preliminary Response, filed Apr. 9, 2017.
(Continued)

*Primary Examiner* — Edward J Dudek, Jr.
*Assistant Examiner* — Ralph A Verderamo, III
(74) *Attorney, Agent, or Firm* — Morgan, Lewis & Bockius LLP

(57) ABSTRACT

A memory module is configured to communicate with a memory controller. The memory module comprises DDR DRAM devices arranged in multiple ranks each of the same width as the memory module, and a module controller configured to receive and register input control signals for a read or write operation from the memory controller and to output registered address and control signals. The registered address and control signals selects one of the multiple ranks to perform the read or write operation. The module controller further outputs a set of module control signals in response to the input address and control signals. The memory module further comprises a plurality of byte-wise buffers controlled by the set of module control signals to actively drive respective byte-wise sections of each data signal associated with the read or write operation between the memory controller and the selected rank.

35 Claims, 13 Drawing Sheets

Related U.S. Application Data continuation of application No. 12/761,179, filed on Apr. 15, 2010, now Pat. No. 8,516,185, which is a continuation-in-part of application No. 12/504,131, filed on Jul. 16, 2009, now Pat. No. 8,417,870.

(51) Int. Cl.
  *G11C 5/02* (2006.01)
  *G11C 5/04* (2006.01)
  *G11C 5/06* (2006.01)

(56) References Cited

U.S. PATENT DOCUMENTS

| | | |
|---|---|---|
| 4,592,011 A | 5/1986 | Mantellina et al. |
| 4,739,473 A | 4/1988 | Ng |
| 5,060,188 A | 10/1991 | Zulian et al. |
| 5,313,624 A | 5/1994 | Harriman |
| 5,345,412 A | 9/1994 | Shiratsuchi |
| 5,463,590 A | 10/1995 | Watanabe |
| 5,513,135 A | 4/1996 | Dell et al. |
| 5,532,954 A | 7/1996 | Bechtolsheim et al. |
| 5,537,584 A | 7/1996 | Miyai et al. |
| 5,541,448 A | 7/1996 | Carpenter |
| 5,572,691 A | 11/1996 | Koudmani |
| 5,617,559 A | 4/1997 | Le et al. |
| 5,630,096 A | 5/1997 | Zuravleff |
| 5,649,159 A | 7/1997 | Le et al. |
| 5,655,113 A | 8/1997 | Leung |
| 5,717,851 A | 2/1998 | Yishay et al. |
| 5,724,604 A | 3/1998 | Moyer |
| 5,729,716 A | 5/1998 | Lee et al. |
| 5,784,705 A | 7/1998 | Leung |
| 5,802,541 A | 9/1998 | Reed |
| 5,905,401 A | 5/1999 | Sher |
| RE36,229 E | 6/1999 | Cady |
| 5,953,280 A | 9/1999 | Watsui |
| 5,973,392 A | 10/1999 | Senba et al. |
| 6,011,710 A | 1/2000 | Wieggers |
| 6,061,754 A | 5/2000 | Cepulis |
| 6,070,217 A | 5/2000 | Connolly et al. |
| 6,141,245 A | 10/2000 | Bertin |
| 6,173,357 B1 | 1/2001 | Ju |
| 6,188,641 B1 | 2/2001 | Uchida |
| 6,205,516 B1 | 3/2001 | Usami |
| 6,223,650 B1 | 5/2001 | Stuck |
| 6,260,127 B1 | 7/2001 | Olarig et al. |
| 6,262,938 B1 | 7/2001 | Lee |
| 6,438,062 B1 | 8/2002 | Curtis |
| 6,446,158 B1 | 9/2002 | Karabatsos |
| 6,480,439 B2 | 11/2002 | Tokutome et al. |
| 6,546,476 B1 | 4/2003 | Gillingham |
| 6,553,449 B1 | 4/2003 | Dodd et al. |
| 6,618,791 B1 | 9/2003 | Dodd et al. |
| 6,636,446 B2 | 10/2003 | Lee |
| 6,683,372 B1 | 1/2004 | Wong et al. |
| 6,704,910 B2 | 3/2004 | Hong |
| 6,717,855 B2 | 4/2004 | Underwood |
| 6,721,860 B2 | 4/2004 | Klein |
| 6,747,887 B2 | 6/2004 | Halbert et al. |
| 6,788,592 B2 | 9/2004 | Nakata et al. |
| 6,832,303 B2 | 12/2004 | Tanaka |
| 6,948,084 B1 | 9/2005 | Manapat et al. |
| 7,024,518 B2 * | 4/2006 | Halbert ............... G06F 13/1689 711/101 |
| 7,093,066 B2 | 8/2006 | Klein |
| 7,130,308 B2 | 10/2006 | Haddock et al. |
| 7,133,960 B1 | 11/2006 | Thompson et al. |
| 7,191,302 B2 | 3/2007 | Usami |
| 7,225,303 B2 | 5/2007 | Choi |
| 7,289,386 B2 | 10/2007 | Bhakta et al. |
| 7,334,150 B2 | 2/2008 | Ruckerbauer et al. |
| 7,379,361 B2 | 5/2008 | Co et al. |
| 7,464,225 B2 | 12/2008 | Tsern |
| 7,532,537 B2 | 5/2009 | Solomon et al. |
| 7,730,254 B2 | 6/2010 | Risse |
| 7,865,674 B2 * | 1/2011 | Gower ............... G06F 13/1684 365/189.02 |
| 7,881,150 B2 | 2/2011 | Solomon et al. |
| 7,916,574 B1 | 3/2011 | Solomon et al. |
| 7,990,746 B2 | 8/2011 | Rajan |
| 8,001,434 B1 | 8/2011 | Lee et al. |
| 8,081,536 B1 | 12/2011 | Solomon et al. |
| 8,089,795 B2 | 1/2012 | Rajan |
| 8,130,560 B1 | 3/2012 | Rajan et al. |
| 8,189,328 B2 | 5/2012 | Kanapathippillai |
| 8,233,303 B2 | 7/2012 | Best |
| 8,244,971 B2 | 8/2012 | Rajan |
| 8,250,295 B2 | 8/2012 | Amidi et al. |
| 8,335,894 B1 | 12/2012 | Rajan |
| 8,417,870 B2 | 4/2013 | Lee et al. |
| 8,516,188 B1 | 8/2013 | Solomon et al. |
| 8,689,064 B1 | 4/2014 | Lee et al. |
| 8,756,364 B1 | 6/2014 | Bhakta et al. |
| 8,782,350 B2 | 7/2014 | Lee et al. |
| 8,856,464 B2 | 10/2014 | Karamcheti |
| 9,606,907 B2 * | 3/2017 | Lee ............... G11C 5/025 |
| 2001/0008006 A1 | 7/2001 | Klein |
| 2002/0048195 A1 | 4/2002 | Klein |
| 2002/0112119 A1 | 8/2002 | Halbert et al. |
| 2003/0070052 A1 | 4/2003 | Lai |
| 2004/0098528 A1 | 5/2004 | Janzen |
| 2005/0010737 A1 | 1/2005 | Ware et al. |
| 2005/0257109 A1 | 11/2005 | Averbui |
| 2005/0281096 A1 | 12/2005 | Bhakta et al. |
| 2006/0117152 A1 | 6/2006 | Amidi et al. |
| 2006/0262586 A1 | 11/2006 | Solomon et al. |
| 2006/0277355 A1 | 12/2006 | Ellsberry et al. |
| 2007/0070669 A1 | 3/2007 | Tsern |
| 2007/0293094 A1 | 12/2007 | Aekins |
| 2008/0025137 A1 | 1/2008 | Rajan et al. |
| 2008/0046631 A1 | 2/2008 | Takaku et al. |
| 2008/0104352 A1 | 5/2008 | Talbot |
| 2008/0162790 A1 | 7/2008 | Im |
| 2009/0103387 A1 | 4/2009 | Shau |
| 2009/0228631 A1 * | 9/2009 | Marulkar ............ G06F 13/1605 711/100 |
| 2009/0248969 A1 | 10/2009 | Wu et al. |
| 2010/0070690 A1 | 3/2010 | Amer et al. |
| 2010/0091540 A1 | 4/2010 | Bhakta et al. |
| 2010/0125681 A1 | 5/2010 | Patel |
| 2011/0090749 A1 | 4/2011 | Bhakta et al. |
| 2011/0125966 A1 | 5/2011 | Amidi et al. |

FOREIGN PATENT DOCUMENTS

| | | |
|---|---|---|
| JP | H10092169 A | 9/1997 |
| JP | 2010320270 | 12/1998 |
| JP | 2000285674 | 10/2000 |
| JP | 2000311485 A | 10/2000 |
| JP | 2002184176 | 6/2002 |
| JP | 2003007963 | 1/2003 |
| JP | 2008046989 | 2/2008 |

OTHER PUBLICATIONS

Inter Partes Review of U.S. Pat. No. 9,606,907, Case No. IPR2018-00362, Exhibits 1003, 'Declaration of Dr. Harold Stone,' filed Dec. 22, 2017.
Inter Partes Review of U.S. Pat. No. 9,606,907, Case No. IPR2018-00362, Exhibits 1009, 'JEDEC Standard Double Data Rate DDR SDRAM Specification, JESD79 Jun. 2000,' filed Dec. 22, 2017.
Inter Partes Review of U.S. Pat. No. 9,606,907, Case No. IPR2018-00362, Exhibits 1010, 'JEDEC Standard 21-C, DDR SDRAM Registered DIMM Design Specification Jan. 2002,' filed Dec. 22, 2017.
Inter Partes Review of U.S. Pat. No. 9,606,907, Case No. IPR2018-00362, Exhibits 1011, 'JEDEC Standard DDR2 SDRAM Specification, JESD79-2B Jan. 2005,' filed Dec. 22, 2017.
Inter Partes Review of U.S. Pat. No. 9,606,907, Case No. IPR2018-00362, Exhibits 1012, 'Declaration of John J. Kelly Regarding

(56) References Cited

OTHER PUBLICATIONS

Records of Joint Electron Device Engineering Council JEDEC,' filed Dec. 22, 2017.
Inter Partes Review of U.S. Pat. No. 9,606,907, Case No. IPR2018-00362, Exhibits 1022, 'Decision Denying Institution of Inter Partes Review of U.S. Pat. No. 8,516,185, *SanDisk Corp.* v. *Netlist, Inc.*, IPR2014-01029, Paper No. 11 Dec. 16, 2014,' filed Dec. 22, 2017.
Inter Partes Review of U.S. Pat. No. 9,606,907, Case No. IPR2018-00362, Exhibits 1023, 'Decision Denying Institution of Inter Partes Review of U.S. Pat. No. 8,516,185, *Smart Modular Techs. Inc.* v. *Netlist, Inc.*, IPR2014-01369, Paper No. 12 Mar. 9, 2015,' filed Dec. 22, 2017.
Inter Partes Review of U.S. Pat. No. 9,606,907, Case No. IPR2018-00362, Exhibits 1024, 'Excerpts from the Hearing in Certain Memory Modules and Components Thereof, and Products Containing Same, Inv. No. 337-TA-1023 May 8, 2017,' filed Dec. 22, 2017.
Inter Partes Review of U.S. Pat. No. 9,606,907, Case No. IPR2018-00362, Exhibits 1025, 'Complainant Netlist, Inc.'s Initial Post-Hearing Brief, Certain Memory Modules and Components Thereof, and Products Containing Same, Inv. No. 337-TA-1023 May 30, 2017 excerpts relevant to '185 patent,' filed Dec. 22, 2017.
Inter Partes Review of U.S. Pat. No. 9,606,907, Case No. IPR2018-00362, Exhibits 1026, 'Respondents' Post-Hearing Brief, Certain Memory Modules and Components Thereof, and Products Containing Same, Inv. No. 337-TA-1023 May 30, 2017 excerpts relevant to '185 patent,' filed Dec. 22, 2017.
Inter Partes Review of U.S. Pat. No. 9,606,907, Case No. IPR2018-00362, Exhibits 1027, 'High-quality versions of demonstrative graphics included in Respondents' Post-Hearing Brief (Ex.1026),' filed Dec. 22, 2017.
Inter Partes Review of U.S. Pat. No. 9,606,907, Case No. IPR2018-00362, Exhibits 1028, 'Complainant Netlist Inc.'s Reply Post-Hearing Brief, Certain Memory Modules and Components Thereof, and Products Containing Same, Inv. No. 337-TA-1023 (Jun. 9, 2017) (excerpts relevant to '185 patent),' filed Dec. 22, 2017.
Inter Partes Review of U.S. Pat. No. 9,606,907, Case No. IPR2018-00362, Exhibits 1029, 'Respondents' Reply Post-Hearing Brief, Certain Memory Modules and Components Thereof, and Products Containing Same, Inv. No. 337-TA-1023 (Jun. 9, 2017) (excerpts relevant to '185 patent),' filed Dec. 22, 2017.
Inter Partes Review of U.S. Pat. No. 9,606,907, Case No. IPR2018-00362, Exhibits 1030, 'High-quality versions of demonstrative graphics included in Respondents' Reply Post-Hearing Brief (Ex. 1029),' filed Dec. 22, 2017.
Inter Partes Review of U.S. Pat. No. 9,606,907, Case No. IPR2018-00362, Exhibits 1031, 'Institution of Inter Partes Review of U.S. Pat. No. 8,516,185, *SK hynix Inc. et al.* v. *Netlist, Inc.*, IPR2017-00577, Paper No. 8 (Jul. 7, 2017),' filed Dec. 22, 2017.
Inter Partes Review of U.S. Pat. No. 9,606,907, Case No. IPR2018-00362, Exhibits 1032, 'Final Written Decision, *Diablo Techs., Inc.* v. *Netlist, Inc.*, IPR2014-00882, Paper No. 33 (Dec. 14, 2015),' filed Dec. 22, 2017.
Inter Partes Review of U.S. Pat. No. 9,606,907, Case No. IPR2018-00362, Exhibits 1033, '*Netlist, Inc.* v. *Diablo Techs., Inc.*, No. 2016-1742 (Fed. Cir. Jul. 25, 2017),' filed Dec. 22, 2017.
Inter Partes Review of U.S. Pat. No. 9,606,907, Case No. IPR2018-00362, Exhibits 1034, 'Netlist's Infringement Claim Chart for U.S. Pat. No. 9,606,907 Jun. 14, 2017,' filed Dec. 22, 2017.
Inter Partes Review of U.S. Pat. No. 9,606,907, Case No. IPR2018-00362, Exhibits 1035, 'Stone, H.S. Microcomputer Interfacing, Reading, MA: Addison Wesley, 1982,' filed Dec. 22, 2017.
Inter Partes Review of U.S. Pat. No. 9,606,907, Case No. IPR2018-00362, Exhibits 1039, 'Intel E7525 Memory Controller Hub (MCH) Chipset Datasheet (Jun. 2004),' filed Dec. 22, 2017.
Inter Partes Review of U.S. Pat. No. 9,606,907, Case No. IPR2018-00362, Exhibits 1040, 'Initial Determination, Certain Memory Modules and Components Thereof, and Products Containing Same, Inv. No. 337-TA-1023 (Nov. 14, 2017) (redacted excerpts),' filed Dec. 22, 2017.
Inter Partes Review of U.S. Pat. No. 9,606,907, Case No. IPR2018-00362, Exhibits 1041, 'Bruce Jacob et al., Memory System: Cache, DRAM, Disk (2008) (excerpts),' filed Dec. 22, 2017.
Inter Partes Review of U.S. Pat. No. 9,606,907, Case No. IPR2018-00362, Exhibits 1042, 'Direct RDRAM datasheet (2000),' filed Dec. 22, 2017.
Inter Partes Review of U.S. Pat. No. 9,606,907, Case No. IPR2018-00363, Petition for Review of U.S. Pat. No. 9,606,907, filed Dec. 22, 2017.
Inter Partes Review of U.S. Pat. No. 9,606,907, Case No. IPR2018-00363, Preliminary Response, filed Apr. 10, 2018.
Inter Partes Review of U.S. Pat. No. 9,606,907, Case No. IPR2018-00364, Petition for Inter Partes Review of U.S. Pat. No. 9,606,907, filed Dec. 27, 2017.
Inter Partes Review of U.S. Pat. No. 9,606,907, Case No. IPR2018-00365, Petition for Inter Partes Review of U.S. Pat. No. 9,606,907, filed Dec. 27, 2017.
Inter Partes Review of U.S. Pat. No. 8,756,364, Case No. IPR2017-00549, Petition for Inter Partes Review, filed Dec. 30, 2016.
Inter Partes Review of U.S. Pat. No. 8,756,364, Case No. IPR2017-00549, Patent Owner's Preliminary Response, filed Apr. 9, 2017.
Inter Partes Review of U.S. Pat. No. 8,756,364, Case No. IPR2017-00549, Patent Owner's Response, filed Sep. 15, 2017.
Inter Partes Review of U.S. Pat. No. 8,756,364, Case No. IPR2017-00549, Petitioners' Objections to Evidence, filed Sep. 22, 2017.
Inter Partes Review of U.S. Pat. No. 8,756,364, Case No. IPR2017-00549, Petitioners Motion to Exclude Certain Inadmissible Testimony of Patent Owners Expert Carl Sechen, filed Jan. 9, 2018.
Inter Partes Review of U.S. Pat. No. 8,756,364, Case No. IPR2017-00549, Petitioners Request for Oral Hearing, filed Jan. 9, 2018.
Inter Partes Review of U.S. Pat. No. 8,756,364, Case No. IPR2017-00549, PO Request for Oral Argument, filed Jan. 9, 2018.
Inter Partes Review of U.S. Pat. No. 8,756,364, Case No. IPR2017-00549, PO Motion for Observations, filed Jan. 9, 2018.
Inter Partes Review of U.S. Pat. No. 8,756,364, Case No. IPR2017-00549, Petitioners' Response to Patent Owner's Motion for Observations, filed Jan. 23, 2018.
Inter Partes Review of U.S. Pat. No. 8,756,364, Case No. IPR2017-00549, PO's Opposition to Petitioner's Motion to Exclude, filed Jan. 23, 2018.
Inter Partes Review of U.S. Pat. No. 8,756,364, Case No. IPR2017-00549, Petitioners' Reply in Support of Motion to Exclude Certain Inadmissible Testimony of Patent Owner's Expert Carl Sechen, filed Jan. 30, 2018.
Inter Partes Review of U.S. Pat. No. 8,756,364, Case No. IPR2017-00549, Petitioners' Updated Exhibit List, filed Feb. 9, 2018.
Inter Partes Review of U.S. Pat. No. 8,756,364, Case No. IPR2017-00549, Patent Owner's Updated Exhibit List, filed Feb. 9, 2018.
Inter Partes Review of U.S. Pat. No. 8,756,364, Case No. IPR2017-00549, Trial Instituted Document, filed May 15, 2017.
Inter Partes Review of U.S. Pat. No. 8,756,364, Case No. IPR2017-00549, Order Trial Hearing, filed Jan. 25, 2018.
Inter Partes Review of U.S. Pat. No. 8,756,364, Case No. IPR2017-00549, Hearing Transcript, filed Mar. 22, 2018.
Inter Partes Review of U.S. Pat. No. 8,756,364, Case No. IPR2017-00549, Final Written Decision, filed May 3, 2018.
Inter Partes Review of U.S. Pat. No. 8,756,364, Case No. IPR2017-00549, Exhibits 1002, 'Excerpts of FH for U.S. Pat. No. 8,756,364,' filed Dec. 30, 2016.
Inter Partes Review of U.S. Pat. No. 8,756,364, Case No. IPR2017-00549, Exhibits 1003, 'Declaration of Harold Stone,' filed Dec. 15, 2017.
Inter Partes Review of U.S. Pat. No. 8,756,364, Case No. IPR2017-00549, Exhibits 1007, 'JEDEC JESD79 publication (Jun. 2000),' filed Dec. 30, 2016.
Inter Partes Review of U.S. Pat. No. 8,756,364, Case No. IPR2017-00549, Exhibits 1008, 'JEDEC Declaration for DDR Specification,' filed Dec. 30, 2016.
Inter Partes Review of U.S. Pat. No. 8,756,364, Case No. IPR2017-00549, Exhibits 1015, 'Texas Instruments 74LS245 datasheet (2002),' filed Dec. 30, 2016.

(56) References Cited

OTHER PUBLICATIONS

Inter Partes Review of U.S. Pat. No. 8,756,364, Case No. IPR2017-00549, Exhibits 1017, '2000-03 Samsung CMOS SDRM data sheet,' filed Sep. 15, 2017.
Inter Partes Review of U.S. Pat. No. 8,756,364, Case No. IPR2017-00549, Exhibits 1019, 'Final Decision [IPR2014-01011],' filed Sep. 15, 2017.
Inter Partes Review of U.S. Pat. No. 8,756,364, Case No. IPR2017-00549, Exhibits 1020, 'Final Decision [IPR2014-00883],' filed Dec. 30, 2016.
Inter Partes Review of U.S. Pat. No. 8,756,364, Case No. IPR2017-00549, Exhibits 1023, 'Gordon_Moore_1965_article,' filed Dec. 30, 2016.
Inter Partes Review of U.S. Pat. No. 8,756,364, Case No. IPR2017-00549, Exhibits 1024, 'Deposition Transcript of Carl Sechen (Dec. 8, 2017),' filed Dec. 15, 2017.
Inter Partes Review of U.S. Pat. No. 8,756,364, Case No. IPR2017-00549, Exhibits 1025, 'Supplemental Declaration of Harold S. Stone (Dec. 15, 2017),' filed Dec. 15, 2017.
Inter Partes Review of U.S. Pat. No. 8,756,364, Case No. IPR2017-00549, Exhibits 1026, 'Xilinx CoolRunner XPLA3 CPLD product specification (2000),' filed Dec. 15, 2017.
Inter Partes Review of U.S. Pat. No. 8,756,364, Case No. IPR2017-00549, Exhibits 1027, 'Xilinx Programmable Logic Design Quick Start Handbook (2004),' filed Jan. 9, 2018.
Inter Partes Review of U.S. Pat. No. 8,756,364, Case No. IPR2017-00549, Exhibits 1028, 'Xilinx TQFP package datasheet (2000),' filed Jan. 9, 2018.
Inter Partes Review of U.S. Pat. No. 8,756,364, Case No. IPR2017-00549, Exhibits 1029, 'Xilinx VQFP package datasheet (2002),' filed Feb. 9, 2018.
Inter Partes Review of U.S. Pat. No. 8,756,364, Case No. IPR2017-00549, Exhibits 1030, 'Xilinx CS280 package datasheet (1999),' filed Dec. 15, 2017.
Inter Partes Review of U.S. Pat. No. 8,756,364, Case No. IPR2017-00549, Exhibits 1031, 'Petitioners Demonstratives,' filed Apr. 9, 2017.
Inter Partes Review of U.S. Pat. No. 8,756,364, Case No. IPR2017-00549, Exhibits 2001, 'Exhibit 2001,' filed Dec. 15, 2017.
Inter Partes Review of U.S. Pat. No. 8,756,364, Case No. IPR2017-00549, Exhibits 2002, 'Exhibit 2002,' filed Dec. 15, 2017.
Inter Partes Review of U.S. Pat. No. 8,756,364, Case No. IPR2017-00549, Exhibits 2003, 'Exhibit 2003,' filed Feb. 9, 2018.
Inter Partes Review of U.S. Pat. No. 8,756,364, Case No. IPR2017-00549, Exhibits 2004, 'Exhibit 2004,' filed Dec. 30, 2016.
Inter Partes Review of U.S. Pat. No. 8,756,364, Case No. IPR2017-00549, Exhibits 2005, 'Exhibit 2005,' filed Sep. 15, 2017.
Inter Partes Review of U.S. Pat. No. 8,516,185, Case No. IPR2017-00577, Patent Owner's Preliminary Response, filed Apr. 10, 2017.
Inter Partes Review of U.S. Pat. No. 8,516,185, Case No. IPR2017-00577, Petitioners' Updated Exhibit List, filed Jun. 21, 2017.
Inter Partes Review of U.S. Pat. No. 8,516,185, Case No. IPR2017-00577, Patent Owner's Response, filed Oct. 25, 2017.
Inter Partes Review of U.S. Pat. No. 8,516,185, Case No. IPR2017-00577, Petitioners' Objections to Evidence, filed Oct. 31, 2017.
Inter Partes Review of U.S. Pat. No. 8,516,185, Case No. IPR2017-00577, Petitioners' Reply to Patent Owner's Response, filed Feb. 6, 2018.
Inter Partes Review of U.S. Pat. No. 8,516,185, Case No. IPR2017-00577, Patent Owner's Objections to Evidence, filed Feb. 13, 2018.
Inter Partes Review of U.S. Pat. No. 8,516,185, Case No. IPR2017-00577, Petitioners' Request for Oral Hearing, filed Feb. 28, 2018.
Inter Partes Review of U.S. Pat. No. 8,516,185, Case No. IPR2017-00577, Patent Owner's Request for Oral Argument, filed Feb. 28, 2018.
Inter Partes Review of U.S. Pat. No. 8,516,185, Case No. IPR2017-00577, Patent Owner's Motion to Exclude, filed Feb. 28, 2018.
Inter Partes Review of U.S. Pat. No. 8,516,185, Case No. IPR2017-00577, Petitioners' Opposition to Patent Owner's Motion to Exclude, filed Mar. 14, 2018.
Inter Partes Review of U.S. Pat. No. 8,516,185, Case No. IPR2017-00577, Patent Owner's Reply to Petitioner's Opposition to Motion to Exclude, filed Mar. 21, 2018.
Inter Partes Review of U.S. Pat. No. 8,516,185, Case No. IPR2017-00577, Notice of Accord Filing Date, filed Jan. 10, 2017.
Inter Partes Review of U.S. Pat. No. 8,516,185, Case No. IPR2017-00577, Trial Instituted Document, filed Jul. 7, 2017.
Inter Partes Review of U.S. Pat. No. 8,516,185, Case No. IPR2017-00577, Order—Request for Oral Argument—37 CFR 42.70, filed Apr. 2, 2018.
Inter Partes Review of U.S. Pat. No. 8,516,185, Case No. IPR2017-00577, Exhibits 1003, 'Declaration of Harold S. Stone,' filed Jan. 5, 2017.
Inter Partes Review of U.S. Pat. No. 8,516,185, Case No. IPR2017-00577, Exhibits 1007, 'JEDEC JESD79 publication (Jun. 2000),' filed Jan. 5, 2017.
Inter Partes Review of U.S. Pat. No. 8,516,185, Case No. IPR2017-00577, Exhibits 1009, 'TI 74LS245 datasheet (2002),' filed Apr. 10, 2017.
Inter Partes Review of U.S. Pat. No. 8,516,185, Case No. IPR2017-00577, Exhibits 1010, 'JEDEC Declaration,' filed Jan. 5, 2017.
Inter Partes Review of U.S. Pat. No. 8,516,185, Case No. IPR2017-00577, Exhibits 1011, 'IPR2014-01369 Aug. 23, 2014 Petition for Inter Partes Review,' filed Jan. 5, 2017.
Inter Partes Review of U.S. Pat. No. 8,516,185, Case No. IPR2017-00577, Exhibits 1012, 'IPR2014-01029 Jun. 24, 2014 Petitioner for Inter Partes Review,' filed Apr. 10, 2017.
Inter Partes Review of U.S. Pat. No. 8,516,185, Case No. IPR2017-00577, Exhibits 1025, 'US Patent Application Publication 2011/0016250,' filed Jun. 21, 2017.
Inter Partes Review of U.S. Pat. No. 8,516,185, Case No. IPR2017-00577, Exhibits 1026, 'Netlist's post-hearing brief,' filed Jun. 21, 2017.
Inter Partes Review of U.S. Pat. No. 8,516,185, Case No. IPR2017-00577, Exhibits 1027, 'Hynix's post-hearing brief,' filed Oct. 25, 2017.
Inter Partes Review of U.S. Pat. No. 8,516,185, Case No. IPR2017-00577, Exhibits 1028, 'Demonstrative Graphics from hynix's post-hearing brief,' filed Oct. 25, 2017.
Inter Partes Review of U.S. Pat. No. 8,516,185, Case No. IPR2017-00577, Exhibits 1029, 'Netlist's reply post-hearing brief,' filed Oct. 25, 2017.
Inter Partes Review of U.S. Pat. No. 8,516,185, Case No. IPR2017-00577, Exhibits 1030, 'hynix's reply post-hearing brief,' filed Jun. 21, 2017.
Inter Partes Review of U.S. Pat. No. 8,516,185, Case No. IPR2017-00577, Exhibits 1031, 'Demonstrative Graphics from hynix's reply post-hearing brief,' filed Jun. 21, 2017.
Inter Partes Review of U.S. Pat. No. 8,516,185, Case No. IPR2017-00577, Exhibits 2001, 'Exhibit 2001,' filed Jun. 21, 2017.
Inter Partes Review of U.S. Pat. No. 8,516,185, Case No. IPR2017-00577, Exhibits 2002, 'Exhibit 2002,' filed Jun. 21, 2017.
Inter Partes Review of U.S. Pat. No. 8,516,185, Case No. IPR2017-00577, Exhibits 2003, 'Exhibit 2003,' filed Oct. 25, 2017.
Inter Partes Review of U.S. Pat. No. 8,516,185, Case No. IPR2017-00577, Exhibits 2004, 'Exhibit 2004,' filed Oct. 25, 2017.
Inter Partes Review of U.S. Pat. No. 8,516,185, Case No. IPR2017-00577, Exhibits 2005, 'Exhibit 2005,' filed Dec. 30, 2016.
Inter Partes Review of U.S. Pat. No. 8,516,185, Case No. IPR2017-00577, Exhibits 2006, 'Exhibit 2006,' filed Dec. 30, 2016.
Inter Partes Review of U.S. Pat. No. 8,516,185, Case No. IPR2017-00577, Exhibits 2007, 'Exhibit 2007,' filed Dec. 30, 2016.
Anonymous. (Dec. 1996). "Applications Note: Understanding DRAM Operation," IBM, 10 pages.
Altera, ACEX iK, Programmable Logic Device Family, Data Sheet, May 2003, Ver 3.4.
Behrens, S. "HP Printer Memory Explained", The ZonkPage, Last Updated Jan. 21, 2004. Accessed Feb. 10, 2013, Retrieved from the Internet: URL<http://warshaft.com/hpmem.htm>. 7pp.
English Translation of the Notice of Grounds for Rejection, Korean Patent Application No. 2012-7004038, dated May 11, 2016.
Examination Report, European Patent Application No. 10730021.2, dated Apr. 14, 2014.

(56) References Cited

OTHER PUBLICATIONS

Response to Examination Report, European Patent Application No. 10730021.2, dated Jun. 4, 2014.
Examination Report, European Patent Application No. 10730021.2, dated Apr. 29, 2015.
Inter Partes Review Case No. IPR2014-01029, Petition for Inter Partes Review of U.S. Pat. No. 8,516,185, filed on Jun. 24, 2014.
Inter Partes Review Case No. IPR2014-01029, Exhibit 1008 to Petition for Inter Partes Review, "Declaration of Charles J. Neuhauser, Ph.D. under 37 C.F.R. § 1.68," filed on Jun. 24, 2014.
Inter Partes Review Case No. IPR2014-01029, Supplemental Petition for Inter Partes Review of U.S. Pat. No. 8,516,185, filed on Jul. 23, 2014.
Inter Partes Review Case No. IPR2014-01029, Patent Owner's Preliminary Response pursuant to 37 C.F.R. § 42.107, filed on Oct. 17, 2014.
Inter Partes Review Case No. IPR2014-01029, Decision Denying Institution of Inter Partes Review 37 C.F.R. § 42.108, issued Dec. 16, 2014.
Inter Partes Review Case No. IPR2014-01369, Corrected Petition for Inter Partes Review of Claims 1-19 of U.S. Pat. No. 8,516,185, filed on Sep. 22, 2014.
Inter Partes Review Case No. IPR2014-01369, Exhibit 1008 to Corrected Petition for Inter Partes Review, "Declaration of Dr. Nader Bagherzadeh under 37 C.F.R. § 1.68," filed on Sep. 22, 2014.
Inter Partes Review Case No. IPR2014-01369, Exhibit 1013 to Corrected Petition for Inter Partes Review, "Webster's II New College Dictionary," filed on Sep. 22, 2014.
Inter Partes Review Case No. IPR2014-01369, Exhibit 1014 to Corrected Petition for Inter Partes Review, "Standard Dictionary of Electrical and Electronics Terms," IEEE 1988, filed on Sep. 22, 2014.
Inter Partes Review Case No. IPR2014-00882, Corrected Petition for Inter Partes Review of U.S. Pat. No. 7,881,150, filed on Jul. 8, 2014.
Inter Partes Review Case No. IPR2014-00882, Exhibit 1007 to Petition for Inter Partes Review, "Declaration of Dr. Srinivasan Jagannathan," filed on Jun. 22, 2014.
Inter Partes Review Case No. IPR2014-00883, Corrected Petition for Inter Partes Review of U.S. Pat. No. 8,081,536, filed on Jul. 8, 2014.
Inter Partes Review Case No. IPR2014-00883, Exhibit 1011 to Petition for Inter Partes Review, "Declaration of Dr. Srinivasan Jagannathan," filed on Jun. 21, 2014.
Inter Partes Review Case No. IPR2014-01011, Corrected Petition for Inter Partes Review of U.S. Pat. No. 7,881,150, filed on Jul. 8, 2014.
Inter Partes Review Case No. IPR2014-01011, Exhibit 1007 to Petition for Inter Partes Review, "Declaration of Dr. Srinivasan J Jagannathan." filed on Jun. 22,2014.
Inter Partes Review of U.S. Pat. No. 7,881,150, IPR Case No. IPR2014-00882, Patent Owner's Preliminary Response Pursuant to 37 C.F.R. § 42.107, filed Oct. 7, 2014.
Inter Partes Review of U.S. Pat. No. 7,881,150, IPR Case No. IPR2014-00882, Decision—Institution of Inter Partes Review 37 C.F.R. § 42.108, issued Dec. 16, 2014.
Inter Partes Review of U.S. Pat. No. 8,081,536, IPR Case No. IPR2014-00883, Patent Owner's Preliminary Response Pursuant to 37 C.F.R. § 42.107, filed Oct. 7, 2014.
Inter Partes Review of U.S. Pat. No. 8,081,536, IPR Case No. IPR2014-00883, Decision—Institution of Inter Partes Review 37 C.F.R. § 42.108, issued Dec. 16, 2014.
Inter Partes Review of U.S. Pat. No. 7,881,150, IPR Case No. IPR2014-01011, Patent Owner's Preliminary Response Pursuant to 37 C.F.R. § 42.107, filed Oct. 7, 2014.
Inter Partes Review of U.S. Pat. No. 7,881,150, IPR Case No. IPR2014-01011, Decision—Institution of Inter Partes Review 37 C.F.R. § 42.108, issued Dec. 16, 2014.

Inter Partes Review of U.S. Pat. No. 7,881,150, IPR Case No. IPR2014-01011, Exhibit 3001 to Decision—Institution of Inter Partes Review, Excerpts from IEEE Dictionary, issued Dec. 16, 2014.
Inter Partes Review of U.S. Pat. No. 7,881,150, IPR Case No. IPR2014-01011, Exhibit 3002 to Decision—Institution of Inter Partes Review, Excerpts from IEEE Dictionary, issued Dec. 16, 2014.
Inter Partes Review of U.S. Pat. No. 7,881,150, IPR Case No. IPR2014-01011, Exhibit 3003 to Decision—Institution of Inter Partes Review, Excerpts from Oxford English Dictionary, issued Dec. 16, 2014.
Inter Partes Review of U.S. Pat. No. 7,881,150, IPR Case No. IPR2014-01011, Exhibit 3004 to Decision—Institution of Inter Partes Review, Excerpts from Oxford English Dictionary, issued Dec. 16, 2014.
Inter Partes Review of U.S. Pat. No. 7,881,150, Case No. IPR2015-01020, Petitioner1s Reply, filed May 19, 2016.
Inter Partes Review of U.S. Pat. No. 7,881,150, Case No. IPR2015-01020, Petitioner Request for Oral Argument, filed Jun. 2, 2016.
Inter Partes Review of U.S. Pat. No. 7,881,150, Case No. IPR2015-01020, Patent Owner Motion for Observations, filed Jun. 2, 2016.
Inter Partes Review of U.S. Pat. No. 7,881,150, Case No. IPR2015-01020, Patent Owner Request for Oral Argument, filed Jun. 2, 2016.
Inter Partes Review of U.S. Pat. No. 7,881,150, Case No. IPR2015-01020, Order Trial Hearing, filed Jun. 8, 2016.
Inter Partes Review of U.S. Pat. No. 7,881,150, Case No. IPR2015-01020, Patent Owner1s Submission on Propriety of Petitioner Reply, filed Jun. 9, 2016.
Inter Partes Review of U.S. Pat. No. 7,881,150, Case No. IPR2015-01020, Petitioner1s Response to Motion for Observations, filed Jun. 10, 2016.
Inter Partes Review of U.S. Pat. No. 7,881,150, Case No. IPR2015-01020, Petitioner1s Response to Netlist1s Submission, filed Jun. 13, 2016.
Inter Partes Review of U.S. Pat. No. 7,881,150, Case No. IPR2015-01020, Patent Owner1s Objections to Petitioner1s Demonstrative Exhibits, filed Jun. 23, 2016.
Inter Partes Review of U.S. Pat. No. 7,881,150, Case No. IPR2015-01020, Patent Owner1s Demonstrative Exhibits, filed Jun. 24, 2016.
Inter Partes Review of U.S. Pat. No. 7,881,150, Case No. IPR2015-01020, Petitioner1s Updated Exhibit List, filed Jun. 24, 2016.
Inter Partes Review of U.S. Pat. No. 7,881,150, Case No. IPR2015-01020, Supplemental Declaration of Dr. Jagannathan, filed May 19, 2016.
Inter Partes Review of U.S. Pat. No. 7,881,150, Case No. IPR2015-01020, May 10, 2016 Deposition of Carl Sechen, filed May 19, 2016.
Inter Partes Review of U.S. Pat. No. 7,881,150, Case No. IPR2015-01020, Petitioner1s Demonstrative Exhibits, filed Jun. 24, 2016.
Inter Partes Review of U.S. Pat. No. 7,881,150, Case No. IPR2015-01020, Exhibit 2007, "Deposition of Dr. Srinivasan Jagannathan on May 25, 2016," filed Jun. 2, 2016.
Inter Partes Review of U.S. Pat. No. 8,081,536, Case No. IPR2015-01021, Petitioner1s Reply, filed May 19, 2016.
Inter Partes Review of U.S. Pat. No. 8,081,536, Case No. IPR2015-01021, Petitioner Request for Oral Argument, filed Jun. 2, 2016.
Inter Partes Review of U.S. Pat. No. 8,081,536, Case No. IPR2015-01021, Patent Owner Motion for Observations, filed Jun. 2, 2016.
Inter Partes Review of U.S. Pat. No. 8,081,536, Case No. IPR2015-01021, Patent Owner Request for Oral Argument, filed Jun. 2, 2016.
Inter Partes Review of U.S. Pat. No. 8,081,536, Case No. IPR2015-01021, Patent Owner1s Submission on Propriety of Petitioner Reply, filed Jun. 9, 2016.
Inter Partes Review of U.S. Pat. No. 8,081,536, Case No. IPR2015-01021, Petitioner1s Response to Motion for Observations, filed Jun. 10, 2016.
Inter Partes Review of U.S. Pat. No. 8,081,536, Case No. IPR2015-01021, Petitioner1s Response to Patent Owner1s Submission, filed Jun. 13, 2016.
Inter Partes Review of U.S. Pat. No. 8,081,536, Case No. IPR2015-01021, Patent Owner1s Objections to Petitioner1s Demonstrative Exhibits, filed Jun. 23, 2016.

(56) References Cited

OTHER PUBLICATIONS

Inter Partes Review of U.S. Pat. No. 8,081,536, Case No. IPR2015-01021, Patent Owner1s Demonstrative Exhibits, filed Jun. 24, 2016.
Inter Partes Review of U.S. Pat. No. 8,081,536, Case No. IPR2015-01021, Petitioner1s Updated Exhibit List, filed Jun. 24, 2016.
Inter Partes Review of U.S. Pat. No. 8,081,536, Case No. IPR2015-01021, Supplemental Declaration of Dr. Jagannathan, filed May 19, 2016.
Inter Partes Review of U.S. Pat. No. 8,756,364, Case No. IPR2017-00549, Exhibit 1003, "Declaration of Harold S. Stone," filed Dec. 30, 2016.
Inter Partes Review of U.S. Pat. No. 8,516,185, Case No. IPR2017-00577, Petition for Inter Partes Review, filed Jan. 5, 2017.
Inter Partes Review of U.S. Pat. No. 8,516,185, Case No. IPR2017-00577, Exhibit 1003, "Declaration of Harold S. Stone," filed Jan. 5, 2017.
Inter Partes Review of U.S. Pat. No. 8,516,185, Case No. IPR2017-00577, Exhibit 1010, Declaration of John J. Kelly Regarding Records of Joint Electron Device Engineering Council (JEDEC), filed Jan. 5, 2017.
Horowitz, "The Art of Electronics," Cambridge Univ. Press, 1989, selected pages.
Huang et al, "An Efficient Parallel Transparent BIST Method for Multiple Embedded Memory Buffers," VLSI Design 2011, p. 379.
Jacob, Bruce L.; "Synchronous DRAM Architectures, Organizations, and Alternative Technologies". University of Maryland, Dec. 10, 2002.
JEDEC Standard No. 21-C Section 4.5.7, 168 Pin Registered SDRAM DIMM Family, Release 7.
JEDEC 21-C, Section 4..6.1, 278 Pin Buffered SDRAM DIMM Family.
JEDEC Standard No. 21-C Section 4.1.2.5, Appendix E, "Specific PD's for Synchronous DRAM (SDRAM)," pp. 1-25.
JEDEC Standard, "Fully Buffered DIMM (FBDIMM): DFx Design for Validation and Test," JESD82-28, Feb. 2008.
JEDEC Standard Double Data Rate (DDR) SDRAM Specification, JESD79 (Jun. 2000).
McCluskey, Edward J., *Logic Design PrincJ,p/es with Emphasis on Testable Semicustom rCircuits*, Prentice Hall, 1986, pp. 104-107 and 119-120.
G. Moore, "Cramming more components onto integrated circuits," Electronics, vol. 38, No. 8, Apr. 19, 1965.
Non-Final Office Action, U.S. Appl. No. 13/412,243, dated Jan. 2, 2014, 20 pages.
Non-final office action, U.S. Appl. No. 13/288,850, dated Oct. 11, 2013, 24 pages.
Non-final office action, U.S. Appl. No. 13/411,344, dated Dec. 31, 2013, 28 pages.
Non-final office action, U.S. Appl. No. 13/473,413, dated Nov. 17, 2011, 46 pages.
Response to non-final office action dated Oct. 14, 2013 for U.S. Appl. No. 13/288,850, filed Jan. 13, 2014, 15 pages.
Response to non-final office action dated Dec. 31, 2013 for U.S. Appl. No. 13/411,344, filed Mar. 31, 2014, 12 pages.
Patent Owner's Response to Office Action mdated ailed Nov. 13, 2012 for Reexamination Control Nos. 95/000,578; 95/000,579, and 95/001,339, filed Jan. 14, 2013, 96 pages.
Patent Owner's Response to Office Action dated Dec. 19, 2012 for Reexamination Control No. 95/001,758, filed Mar. 19, 2013, 61 pages.
Patent Owner's Response to Office Action dated Sep. 26, 2013 for Reexamination Control No. 95/001,758, filed Nov. 26, 2013, 85 pages.
Third Party Requester's Comments after Non-Final Action dated Sep. 26, 2013 for Reexamination Control No. 95/001,758, filed Dec. 26, 2013.
Patent Owner's Appeal Brief for Reexamination Control Nos. 95/000,546 and 95/000,577, filed Oct. 2, 2013, 46 pages.
Patent Trial and Appeal Board Decision on Appeal for Reexamination Control No. 95/001/337, mailed Jan. 16, 2014, 30 pages.
Patent Trial and Appeal Board Decision on Appeal for Reexamination Control No. 95/001/381, mailed Jan. 16, 2014, 24 pages.
Action Closing Prosecution mailed Mar. 27, 2014 for Reexamination Control No. 95/001,758, filed Sep. 14, 2011, 40 pages.
Action Closing Prosecution mailed Mar. 27, 2014 for Reexamination Control No. 95/001,339, filed Jun. 8, 2010, 106 pages.
Petition for Inter Partes Review filed on Jun. 24, 2014 for U.S. Pat. No. 8,516,185, IPR Case No. IPR2014-01029, and all associated documents including cited references and expert declarations, available at https://i;itabtr1als.uspto.gov.
Petition for Inter Partes Review filed on Jun. 22, 2014 for U.S. Pat. No. 7,881,150, IPR Case No. IPR2014-00882 and IPR Case No. IPR2014-01011, and all associated documents including cited references and expert declarations, available at https://ptabtriais.usto.gov.
Petition for Inter Partes Review filed on Jun. 24, 2014 for U.S. Pat. No. 8,081,536, IPR Case No. IPR2014-00883, and all associated documents including cited references and expert declarations, available at https://_tabtrials.uspto._gov.
Reese, "Introduction to Logic Synthesis using Verilog HDL," Morgan&Claypool Publisher, 2006, pp. 1-28.
Notice of Allowance, U.S. Appl. No. 12/504,131, dated Feb. 12, 2013, 52 pgs.
Response to Non-Final Office Action dated Jan. 2, 2014, filed Apr. 2, 2004, for U.S. Appl. No. 13/287,042, filed Nov. 1, 2011, 12 pages.
Office Action dated Apr. 2, 2014, for Japanese Patent Application No. 2012-520662 and English translation thereof, 7 pages.
128Mbit Sdram, Samsung datasheet K4S281632C, Rev. 00. Mar. 2000.
Stone, H.S. Microcomputer Interfacing, Reading, MA: Addison Wesley, 1982.
Texas Instruments SN74LS245 octal bus transceivers with 3-state outputs datasheet, 2002.
U.S. District Court Northern District of California, Case No. 4:13-CV-05889-YGR, *Netlist, Inc. v. Smart Storage Systems, Inc., and Diablo Technologies, Inc.*, Smart Storage Systems, 1nc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits E.1-E.7 to "Smart Storage Systems, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits F.1-F.5 to "Smart Storage Systems, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits G.1-G.6 to "Smart Storage Systems, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Smart Storage Systems, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Diablo Technologies, 1nc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits D-1 to D6 to "Diablo Technologies, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits F-1 to F-5 to "Diablo Technologies, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits G-1 to G-6 to "Diablo Technologies, 1nc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Diablo Technologies, 1nc.'s Invalidity Contentions," dated Jun. 6, 2014.

(56) References Cited

OTHER PUBLICATIONS

Anonymous. (May 2002). "Hynix HYMD512G726(L)8-K/H/L Registered DOR SDRAM DIMM, 128M×72 bits Product Description," Rev. 0.1/May, 02, pp. 1-16.
"Elipida Memory to Speak at Intel's Memory Implementers Forum Roundtable Event", Intel Developer Forum, [Online]. Retrieved from the Internet: <URSL: http://www.elpida.com/en/news/2004/02-18.html>, (Jun. 14, 2011), 1 pg.
*Google, Inc. v. Netlist, Inc.*, No. 4:08-cv-04144-SBA, Netlist Inc.'s Answer to Complaint and Counterclaim (N.D. Ca. Filed Nov. 18, 2008).
*Google, Inc. v. Netlist, Inc.*, No. C 08-04144 SBA Google Inc.'s Invalidity Contentions Pursuant to PAT. L.F. 3-3, dated Apr. 13, 2009.
*Google, Inc. v. Netlist, Inc.*, No. C08 04144, Complaint for Declaratory Relief, (N.D. Ca Dated Aug. 29, 2008).
Inte(6400/6402 Advanced Memory Buffer Datasheet, published Oct. 2006.
Letter from G. Hopkins Guy III, Orrick, Herrington & Sutcliffe LLP, to R. Scott Oliver, Morrison & Foerster, (Apr. 14, 2009).
Luthra et al. "Interface Synthesis Using Memory Mapping for an FPGA Platform," Proceedings of the 21st International Conference on Computer Design, 2003.
*MetaRAM, Inc. v. Netlist, Inc.* No. 3:09-cv-01309-VRW, MetaRam's Reply to Netlist's Counterclaims, (N.D. Ca. Filed Jun. 3, 2009).
*MetaRam, Inc. v. Netlist, Inc.*, No. 3:09-cv-01309-VRW, Netlist's Answer to Complaint and Counterclaims, (N.D. Ca, filed May 11, 2009).
*MetaRAM, Inc. v. Netlist, Inc.*, No. C09 01309, Complaint for Patent Infringement, (N.D. Ca. Filed Mar. 25, 2009).
Micron "DDR2 SDRAM Registered DIMM (RDIMM)," 2003 Micron Technology, Inc. 18 pages.
Micron "Synchronous DRAM Module MT18LSDT472," 1998, Micron Technology, Inc., 17 pages.
Micron Technical Note, "Decoupling Capacitor Calculations for a DOR Memory Channel," 2004, 3 pages.
Miles J. Murdocca et al., "Principles of Computer Architecture", Prentice Hall, Inc., Upper Saddle River, NJ, 2000, pp. 243-252.
Murdocca et al., "Principles of Computer Architecture," Prentice Hall, 2000, pp. 249-251.
*Netlist, Inc. v. MetaRam, Inc.*, No. 09-165-GMS, MetaRAM, Inc.'s Answer and Affirmative Defenses to Plaintiff's Complaint, dated Apr. 20, 2009.
*Netlist, Inc. v. MetaRAM, Inc.*, No. 1:09-ccv-00165-GMS, Complaint for Patent Infringement, (D. Del. Filed Mar. 12, 2009).
Non-Final Action Closing Prosecution mailed Sep. 1, 2010, for Control No. 95/001,339, filed Apr. 10, 2010, 17 pages.
Non-Final Action Closing Prosecution mailed Jun. 21, 2011, for Control No. 95/001,381, filed Jun. 9, 2010, 34 pages.
Non-Final Action Closing Prosecution mailed Mar. 12, 2012, for Control No. 95/001,337, filed Apr. 19, 2010, 33 pages.
Non-Final Action mailed Aug. 27, 2010, for Control No. 95/000,546, filed May 11, 2010, 16 pages.
Non-Final Action mailed Sep. 8, 2010, for Control No. 95/001,381, filed Jun. 9, 2010, 17 pages.
Non-Final Action mailed Apr. 4, 2011, for Control No. 95/001,339, filed Apr. 20, 2010, 61 pages. (merged with 95/000,578 and 95/000,579).
Non-Final Action mailed Jun. 15, 2011, for Control No. 95/001,381, filed Jun. 9, 2010, 33 pages.
Non-Final Action mailed Sep. 27, 2011, for Control No. 95/001,337, filed Apr. 19, 2010, 19 pages.
Non-Final Action mailed Oct. 4, 2011, for Control No. 95/001,339, filed Apr. 20, 2010, 77 pages. (merged with 95/000,578 and 95/000,579).
Non-Final Action mailed Oct. 14, 2011, for Control No. 95/001,339, filed Apr. 30, 2010, 99 pages. (merged with 95/000,578 and 95/000,579).
Non-Final Office Action dated Nov. 16, 2011, for U.S. Appl. No. 95/001,758 filed Sep. 14, 2011, 25 pages.
Order Granting Request for Inter Partes Reexamination mailed Nov. 16, 2011, for U.S. Appl. No. 95/001,758, filed Sep. 14, 2011, 13 pages.
Order Granting Request for Inter Partes Reexamination mailed Aug. 9, 2010, for Control No. 95/000,546, filed May 11, 2010, 22 pages.
Order Granting Request for Inter Partes Reexamination mailed Aug. 27, 2010, for Control No. 95/001,337, filed Apr. 19, 2010, 21 pages.
Order Granting Request for Inter Partes Reexamination mailed Sep. 1, 2010, for Control No. 95/001,339, filed Apr. 20, 2010, 14 pages.
Order Granting Request for Inter Partes Reexamination mailed Sep. 8, 2010, for Control No. 95/000,381, filed Jun. 9, 2010, 21 pages.
Order Granting Request for Inter Partes Reexamination mailed Jan. 14, 2011, for Control No. 95/000,579, filed Oct. 21, 2010, 12 pages.
Order Granting Request for Inter Partes Reexamination mailed Jan. 18, 2011, for Control No. 95/000,577, filed Oct. 20, 2010, 17 pages.
Right of appeal Notice mailed Feb. 7, 2012, for Control No. 95/001,381, 33 pages.
Right of Appeal Notice mailed Jun. 22, 2012, for Control No. 95/001,337, filed Jun. 4, 2010, 34 pages.
PC133 SDRAM Registered DIMM Design Specification, Revision 1.1, Aug. 1999, 62 pages.
Texas Instruments, "TM2SR72EPN 2097152 by 72-Bit, TM4SRT2EPN 4194304 by 72-Bit, Synchronous Dynamic RAM Modules," 1997, 15 pages.
U.S. District Court Central District of California, Case No. CV09 06900, *Netlist, Inc.* vs. *Inphi Corporation*, Complaint for Patent Infringement, filed Sep. 22, 2009 in 10 pages.
U.S. District Court Central District of California, Case No. CV09 06900, *Netlist, Inc.* vs. *INPHI Corporation*, Defendant 1nphi Corporation's Answer to Plaintiff's Complaint for Patent Infringement, filed Nov. 12, 2009 in 6 pages.
U.S. District Court Central District of California, Case No. CV09 06900, *Netlist, Inc.* vs. *INPHI Corporation*, Defendant 1nphi Corporation's Answer to Plaintiff's First Amended Complaint for Patent Infringement, filed Feb. 11, 2010 in 9 pages.
U.S. District Court Central District of California, Case No. CV09 06900, *Netlist, Inc.* vs. *INPHI Corporation*, Defendant 1nphi Corporation's Notice of Motion and Motion for Stay Pending Reexaminations and Interference Proceeding Regarding the Patents-In-Suit; Memorandum of Points and Authorities in Support Thereof, filed Apr. 21, 2010 in 28 pages.
U.S. District Court Central District of California, Case No. CV09 06900, *Netlist, Inc.* vs. *INPHI Corporation*, Plaintiff Netlist Inc's Opposition to Defendant Inphi Corporation's Motion for Stay Pending Reexaminations and Interference Proceedings Regarding the Patents-In-Suit, filed May 3, 2010 in 23 pages.
U.S. District Court Central District of California, Case No. CV09 06900, *Netlist, Inc.* vs. *Inphi Corporation*, Plaintiff Netlist, Inc's First Amended Complaint for Patent Infringement, filed Dec. 23, 2009 in 8 pages.
U.S. District Court Northern District of California, Case No. CV08 04144, *Google Inc.* v. *Netlist, Inc.*, Defendant Netlist, Inc.'s Claim Construction Reply Brief, filed Sep. 22, 2009 in 19 pages.
U.S. District Court Northern District of California, Case No. CV08 04144, *Google Inc.* v. *Netlist, Inc.*, Defendant Netlist, Inc.'s Opening Claim Construction Brief, filed Jul. 28, 2009 in 21 pages.
U.S. District Court Northern District of California, Case No. CV08 04144, *Google Inc.* v. *Netlist, Inc.*, Defendant Netlist, Inc.'s Opposition to Google Inc's Motion for Summary Judgment of Invalidity, filed Jul. 6, 2010 in 13 pages.
U.S. District Court Northern District of California, Case No. CV08 04144, *Google Inc.* v. *Netlist, Inc.*, Exhibit A to Joint Claim Construction and Prehearing Statement, filed Jun. 12, 2009 in 2 pages.
U.S. District Court Northern District of California, Case No. CV08 04144, *Google Inc.* v. *Netlist, Inc.*, Exhibit B to Joint Claim Construction and Prehearing Statement, filed Jun. 12, 2009 in 36 pages.
U.S. District Court Northern District of California, Case No. CV08 04144, *Google Inc.* v. *Netlist, Inc.*, Joint Claim Construction and Prehearing Statement, filed Jun. 12, 2009 in 5 pages.
U.S. District Court Northern District of California, Case No. CV08 04144, *Google Inc.* v. *Netlist, Inc.*, Netlist, Inc.'s Answer to Complaint and Counterclaims, filed Nov. 18, 2008 in 9 pages.

(56) References Cited

OTHER PUBLICATIONS

U.S. District Court Northern District of California, Case No. CV08 04144, *Google Inc.* v. *Netlist, Inc.*, Order Re Claim Construction, filed Nov. 16, 2009 in 1 page.
U.S. District Court Northern District of California, Case No. CV08 04144, *Google Inc.* v. *Netlist, Inc.*, Plaintiff Google's Reply to Counterclaims, filed Dec. 8, 2008 in 4 pages.
U.S. District Court Northern District of California, Case No. CV08 04144, *Google Inc.* v. *Netlist, Inc.*, Stipulation Re: Additional Agreed-Upon Claim Constructions, filed Oct. 28, 2009 in 3 pages.
U.S. District Court Northern District of California, Case No. CV08 04144, *Google Inc.* vs. *Netlist, Inc.*, [Redacted] Google Inc.'s Responsive Claim Construction Brief, filed Aug. 25, 2009 in 30 pages.
U.S. District Court Northern District of California, Case No. CV08 04144, *Google Inc.* vs. *Netlist, Inc.*, Amended Exhibit A to Joint Claim Construction and Prehearing Statement, filed Oct. 28, 2009 in 1 page.
U.S. District Court Northern District of California, Case No. CV08 04144, *Google Inc.* vs. *Netlist, Inc.*, Appendix 1 to Google's Responsive Claim Construction Brief, filed Nov. 12, 2009 in 4 pages.
U.S. District Court Northern District of California, Case No. CV08 04144, *Google Inc.* vs. *Netlist, Inc.*, Attachment 1 to Exhibit B to Joint Claim Construction and Prehearing Statement, filed Jun. 12, 2009 in 7 pages.
U.S. District Court Northern District of California, Case No. CV08 04144, *Google Inc.* vs. *Netlist, Inc.*, Attachment 2 to Exhibit B to Joint Claim Construction and Prehearing Statement, filed Jun. 12, 2009 in 12 pages.
U.S. District Court Northern District of California, Case No. CV08 04144, *Google Inc.* vs. *Netlist, Inc.*, Complaint for Declaratory Relief, filed Aug. 29, 2008 in 49 pages.
U.S. District Court Northern District of California, Case No. CV09 05718, *Netlist, Inc.* vs. *Google, Inc.*, Complaint for Patent Infringement, filed Dec. 4, 2009 in 47 pages.
U.S. District Court Northern District of California, Case No. CV09 05718, *Netlist, Inc.* vs. *Google, Inc.*, Defendant Google Inc's Responsive Claim Construction Brief, filed Aug. 4, 2010 in 108 pages.
U.S. District Court Northern District of California, Case No. CV09 05718, *Netlist, Inc.* vs. *Google, Inc.*, Exhibit A to Joint Claim Construction and Prehearing Statement under Patent L. R. 4-3, filed Jun. 25, 2010 in 2 pages.
U.S. District Court Northern District of California, Case No. CV09 05718, *Netlist, Inc.* vs. *Google, Inc.*, Exhibit B to Joint Claim Construction and Prehearing Statement under Patent L. R. 4-3, filed Jun. 25, 2010 in 23 pages.
U.S. District Court Northern District of California, Case No. CV09 05718, *Netlist, Inc.* vs. *Google, Inc.*, Google's Answer to Plaintiff's Complaint for Patent Infringement; and Assertion of Counterclaims, filed Feb. 12, 2010 in 13 pages.
U.S. District Court Northern District of California, Case No. CV09 05718, *Netlist, Inc.* vs. *Google, Inc.*, Joint Claim Construction and Prehearing Statement Under Patent Local Rule 4-3, filed Jun. 25, 2010 in 5 pages.
U.S. District Court Northern District of California, Case No. CV09 05718, *Netlist, Inc.* vs. *Google, Inc.*, Plaintiff Netlist, Inc.'s Reply Claim Construction Brief, filed Aug. 16, 2010 in 17 pages.
U.S. District Court Northern District of California, Case No. CV09 05718, *Netlist, Inc.* vs. *Google, Inc.*, Plaintiff Netlist, Inc.'s Reply to Defendant Google Inc.'s Counterclaim, filed Mar. 8, 2010 in 11 pages.
U.S. District Court Northern District of California, Case No. CV09 05718, *Netlist, Inc.* vs. *Google, Inc.*, Plaintiff Netlist, Inc's Opening Claim Construction Brief, filed Jul. 16, 2010 in 162 pages.
US District Court Civil Docket; *Google Inc.* v. *Netlist Inc.*; 4:08cv04144; filed Aug. 29, 2008.
US District Court Civil Docket; *Netlist Inc.* v. *Google Inc.*; 4:09cv5718, filed Dec. 4, 2009 in 10 pages.
US District Court. Civil Docket; *Netlist Inc.* v. *Inphi Corporation*; 2:09cv6900; Date filed Sep. 22, 2009.
Vogt, Pete, "Fully Buffered DIMM (FB-DIMM) Server Memory Architecture: Capacity, Performance, Reliability, and Longevity," Intel, Feb. 18, 2004, 33 pages.
Reexam U.S. Appl. No. 95/000,546 for U.S. Pat. No. 7,289,386, filed May 11, 2010, Netlist, Inc.
Reexam U.S. Appl. No. 95/000,577 for U.S. Pat. No. 7,289,386, filed Oct. 20, 2010, Netlist, Inc.
Reexam U.S. Appl. No. 95/000,578 for U.S. Pat. No. 7,619,912, filed Oct. 20, 2010, Netlist, Inc.
Reexam U.S. Appl. No. 95/000,579 for U.S. Pat. No. 7,619,912, filed Oct. 21, 2010, Netlist, Inc.
Reexam U.S. Appl. No. 95/001,337 for U.S. Pat. No. 7,636,274, filed Jun. 4, 2010, Netlist, Inc.
Reexam U.S. Appl. No. 95/001,381 for U.S. Pat. No. 7,532,537, filed Jun. 9, 2010, Netlist, Inc.
Reexam U.S. Appl. No. 95/001,338; for U.S. Pat. No. 7,532,537, filed Apr. 19, 2010, Netlist, Inc.
Reexam U.S. Appl. No. 95/001,758 for U.S. Pat. No. 7,864,627, filed Sep. 15, 2010, Netlist, Inc.
Reexam U.S. Appl. No. 95/001,339 for U.S. Pat. No. 7,619,912, filed Jun. 8, 2010, Netlist, Inc.
Reexam U.S. Appl. No. 95/002,399 for U.S. Pat. No. 8,250,295, filed Sep. 15, 2010, Netlist, Inc.
U.S. Appl. No. 11/075,395, filed Mar. 7, 2005, Netlist, Inc.
U.S. Appl. No. 11/173,175, filed Jul. 1, 2005, Netlist, Inc.
U.S. Appl. No. 11/862,931, filed Sep. 27, 2007, Netlist, Inc.
U.S. Appl. No. 12/577,682, filed Oct. 12, 2009, Netlist, Inc.
U.S. Appl. No. 12/954,492, filed Nov. 24, 2010, Netlist, Inc.
U.S. Appl. No. 12/912,623, filed Oct. 26, 2010, Netlist, Inc.
U.S. Appl. No. 11/335,875, filed Jan. 19, 2006, Netlist, Inc.
U.S. Appl. No. 12/408,652, filed Mar. 20, 2009, Netlist, Inc.
U.S. Appl. No. 12/629,827, filed Dec. 2, 2009, Netlist, Inc.
U.S. Appl. No. 12/955,711, filed Nov. 29, 2010, Netlist, Inc.
U.S. Appl. No. 12/981,380, filed Dec. 29, 2010, Netlist, Inc.
U.S. Appl. No. 13/154,172, filed Jun. 6, 2011, Netlist, Inc.
U.S. Appl. No. 13/287,042, filed Nov. 1, 2011, Netlist, Inc.
U.S. Appl. No. 13/473,413, filed May 16, 2012, Netlist, Inc.
U.S. Appl. No. 13/032,470, filed Feb. 22, 2011, Netlist, Inc.
U.S. Appl. No. 13/287,081, filed Nov. 1, 2011, Netlist, Inc.
U.S. Appl. No. 13/971,231, filed Aug. 20, 2013, Netlist, Inc.
U.S. Appl. No. 12/422,853, filed Apr. 13, 2009, Netlist, Inc.
U.S. Appl. No. 13/412,243, filed Mar. 5, 2012, Netlist, Inc.
U.S. Appl. No. 12/422,925, filed Apr. 13, 2009, Netlist, Inc.
U.S. Appl. No. 13/183,253, filed Jul. 14, 2011, Netlist, Inc.
U.S. Appl. No. 13/745,790, filed Jan. 19, 2013, Netlist, Inc.
U.S. Appl. No. 14/229,844, filed Mar. 29, 2014, Netlist, Inc.
U.S. Appl. No. 12/504,131, filed Jul. 16, 2009, Netlist, Inc.
U.S. Appl. No. 12/761,179, filed Apr. 15, 2010, Netlist, Inc.
U.S. Appl. No. 13/288,850, filed Nov. 3, 2011, Netlist, Inc.
U.S. Appl. No. 13/411,344, filed Mar. 2, 2012, Netlist, Inc.
U.S. Appl. No. 13/952,599, filed Jul. 27, 2013, Netlist, Inc.
Inter Partes Review of U.S. Pat. No. 9,606,907, Case No. IPR2018-00362, Paper 14, 'Patent Owner's Response,' filed Oct. 19, 2018.
Inter Partes Review of U.S. Pat. No. 9,606,907, Case No. IPR2018-00362, Exhibits 1047, 'Certified translation of the Examination Decision issued by the State Intellectual Property Office of the P.R.C. (dated May 30, 2018),' filed Feb. 11, 2019.
Inter Partes Review of U.S. Pat. No. 9,606,907, Case No. IPR2018-00362, Exhibits 1048, 'Certified translation of the Preliminary Opinion issued by the German Patent and Trademark Office (dated Jan. 8, 2019),' filed Feb. 11, 2019.
Inter Partes Review of U.S. Pat. No. 9,606,907, Case No. IPR2018-00362, Paper 19, 'Petitioners' Request for Oral Argument,' filed Feb. 19, 2019.
Inter Partes Review of U.S. Pat. No. 9,606,907, Case No. IPR2018-00362, Paper 21, 'Patent Owner Objections to Reply Evidence,' filed Feb. 19, 2019.
Inter Partes Review of U.S. Pat. No. 9,606,907, Case No. IPR2018-00362, Paper 20, 'Patent Owner Request for Oral Argument,' filed Feb. 19, 2019.

(56) References Cited

OTHER PUBLICATIONS

Inter Partes Review of U.S. Pat. No. 9,606,907, Case No. IPR2018-00362, Paper 22, 'Patent Owner Motion to Exclude,' filed Feb. 19, 2019.
Inter Partes Review of U.S. Pat. No. 9,606,907, Case No. IPR2018-00362, Paper 23, 'Corrected Petitioners' Reply to Patent Owner's Response,' filed Feb. 20, 2019.
Inter Partes Review of U.S. Pat. No. 9,606,907, Case No. IPR2018-00362, Paper 28, 'Order—Trial Hearing,' filed Mar. 22, 2019.
Inter Partes Review of U.S. Pat. No. 9,606,907, Case No. IPR2018-00362, Paper 29, 'Termination Decision Document,' filed Jun. 27, 2019.
Inter Partes Review of U.S. Pat. No. 9,606,907, Case No. IPR2018-00362, Paper 30, 'Record of Oral Hearing,' filed Jun. 27, 2019.
Netlist, Inc., Examination Decision of Request for Invalidation, CN201080039043.0, May 30, 2018, 43 pgs.
Inter Partes Review of U.S. Pat. No. 8,516,185 B2, Case No. IPR2017-00577, Record of Oral Hearing, filed Jun. 19, 2018.
Inter Partes Review of U.S. Pat. No. 8,516,185 B2, Case No. IPR2017-00577, Final Written Decision, filed Jul. 5, 2018.
Inter Partes Review of U.S. Pat. No. 7,532,537 B2, Case No. IPR2017-00667, Final Written Decision, filed Jul. 18, 2018.
Inter Partes Review of U.S. Pat. No. 7,532,537 B2, Case No. IPR2017-00668, Final Written Decision, filed Jul. 18, 2018.
Inter Partes Review of U.S. Pat. No. 9,606,907 B2, Case No. IPR2018-00362, Order, *Conduct of the Proceedings*, filed Aug. 2, 2018.
Inter Partes Review of U.S. Pat. No. 9,606,907 B2, Case No. IPR2018-00362, and Case No. IPR2018-00363, Decision Granting Institution of Inter Partes Review, filed Aug. 6, 2018.
Inter Partes Review of U.S. Pat. No. 9,606,907 B2, Case No. IPR2018-00362, and Case No. IPR2018-00363, Exhibit 3001, 'email from Mehran Arjomand,' filed Jul. 30, 2018.
Inter Partes Review of U.S. Pat. No. 9,606,907 B2, Case No. IPR2018-00362, and Case No. IPR2018-00363, Exhibit 3001, 'email from Michael D. Hatcher,' filed Jul. 30, 2018.
Inter Partes Review of U.S. Pat. No. 9,606,907 B2, Case No. IPR2018-00364, and Case No. IPR2018-00365, Decision Granting Institution of Inter Partes Review, filed Jun. 29, 2018.
Inter Partes Review of U.S. Pat. No. 9,606,907 B2, Case No. IPR2018-00364, Patent Owner's Objections to Petition Evidence, filed Aug. 20, 2018.
Response, Article 94 3 EPC, EP 18179414.0, dated Aug. 6, 2019, 23 pgs.
Netlist, Inc., Third Party Observation, EP 3404660, Aug. 6, 2019, 34 pgs.
Office Action, EP 18179414, dated Apr. 2, 2019, 6 pgs.
Patent document filed by third party, EP 18179414, Feb. 22, 2019, 10 pgs.
Observations by third parties, EP 18179414.0, Feb. 22, 2019, 1 pg.
Patent Document filed by a third party, Feb. 20, 2019, 10 pgs.
Netlist, Inc., Observations by third parties, EP 3404660, Feb. 20, 2019, 46 pgs.
Reply to Written Opinion prepared by the EPO, EP 18179414.0, dated Jan. 17, 2019, 20 pgs.
Netlist, Inc., Information on Search Strategy, EP 18179414, Oct. 23, 2018, 1 pg.
European Search Report, EP 18179414, dated Oct. 23, 2018, 3 pgs.
European Search Opinion, EP 18179414, dated Oct. 23, 2018, 3 pgs.
Office Action, European Patent Application No. 18179414.0, dated Jul. 30, 2020, 9 pgs.
Netlist, Inc., Communication Pursuant to Article 94 (3) EPC, 18179414.0, dated Mar. 23, 2020, 5 pgs.
Netlist, Inc., United States Court of Appeals for the Federal Circuit, SK Hynix Inc, Corrected Principal Brief of Appeals, Document 26, Case: 19-2340, filed Feb. 3, 2020, 284 pgs.
Netlist, Inc., United States Court of Appeals for the Federal Circuit, SK Hynix Inc., Response and Cross-Appeal Opening Brief for Cross-Appellant Netlist, Inc., Document 28, Case: 19-2340, Mar. 23, 2020, 80 pgs.
Commission Opinion, United States International Trade Commission, Certain Memory Modules and Components Thereof, Investigation No. 337-TA-1089, Apr. 21, 2020, 30 pgs.
Netlist, Inc., Communication Pursuant to Article 94(3) EPC, EP 18179414.0, dated Mar. 23, 2020, 5 pgs.
Notice of Grant, European Patent Application No. 19159900.0, dated Sep. 17, 2020, 61 pgs.
Office Action, European Patent Application No. 18179414.0, dated Sep. 24, 2020, 5 pgs.

\* cited by examiner

Figure 1A: (Prior Art)
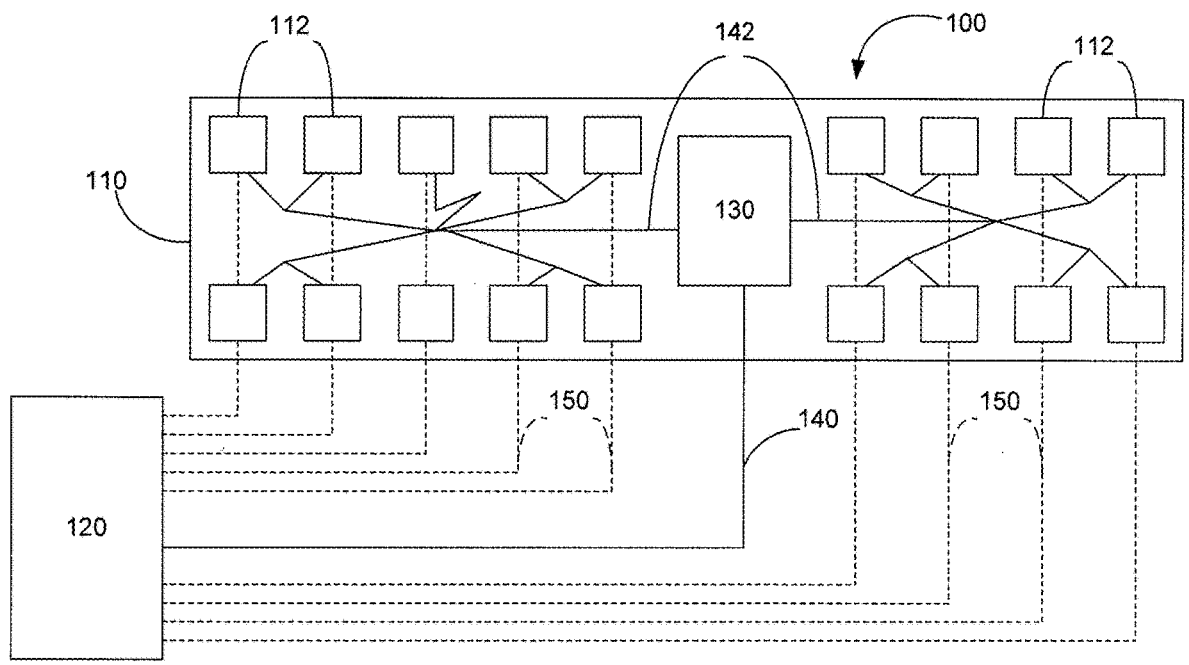

Figure 1B: (Prior Art)
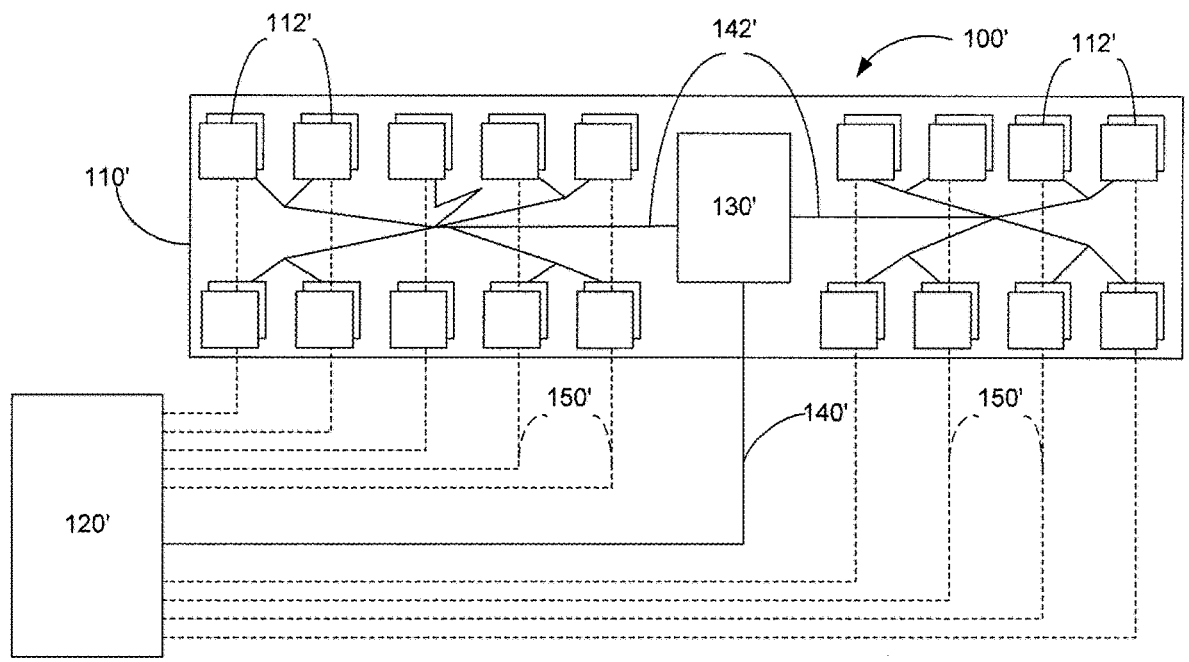

Figure 2A: (Prior Art)
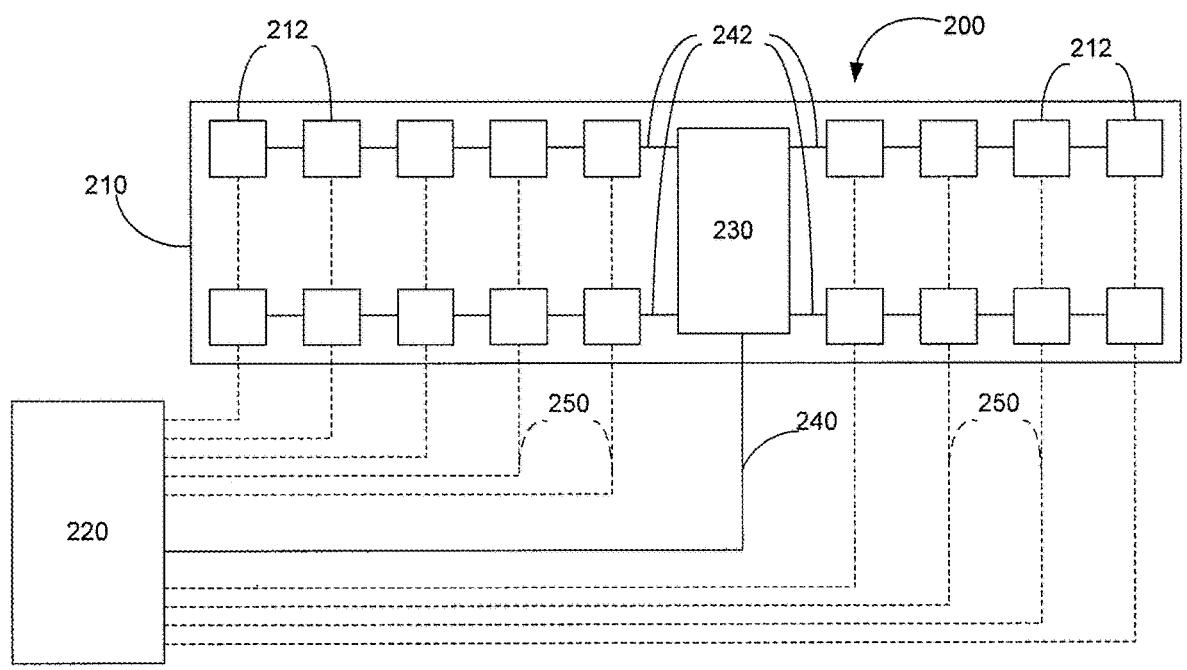

Figure 2B: (Prior Art)
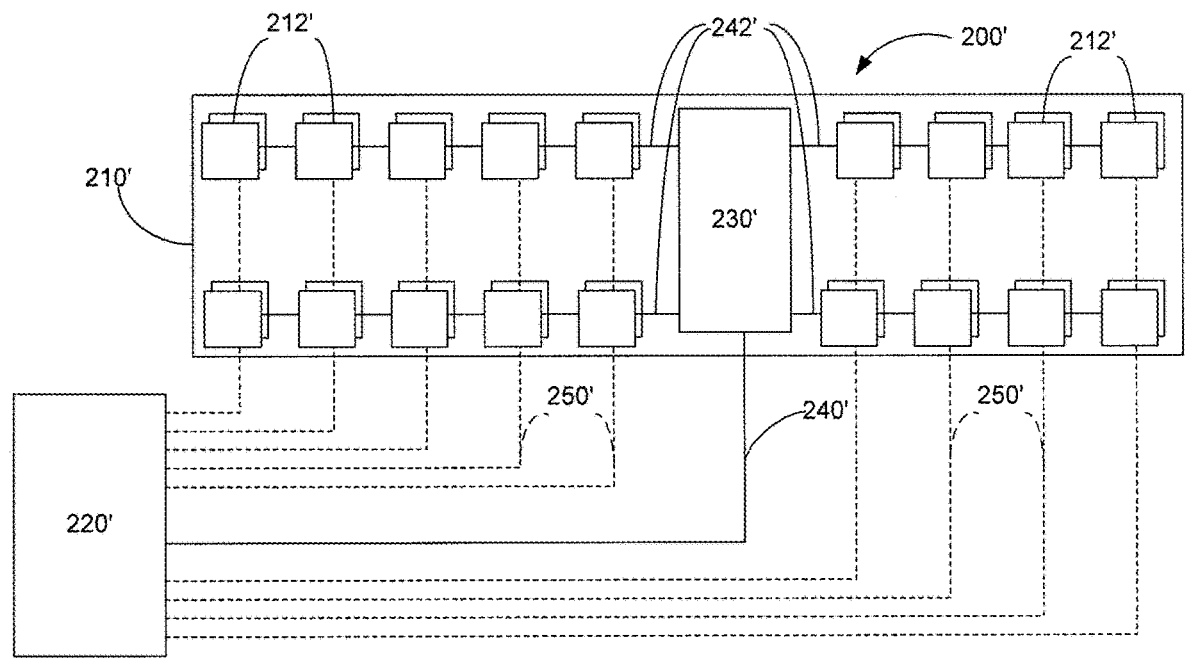

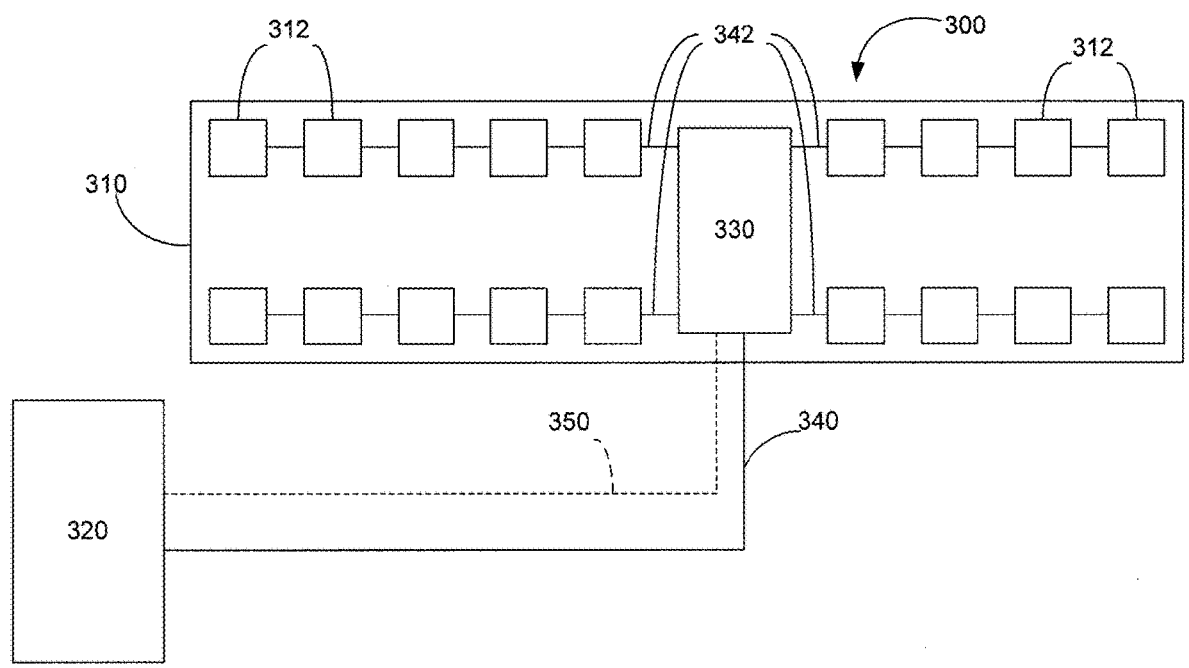
Figure 2C: (Prior Art)

Figure 2D: (Prior Art)
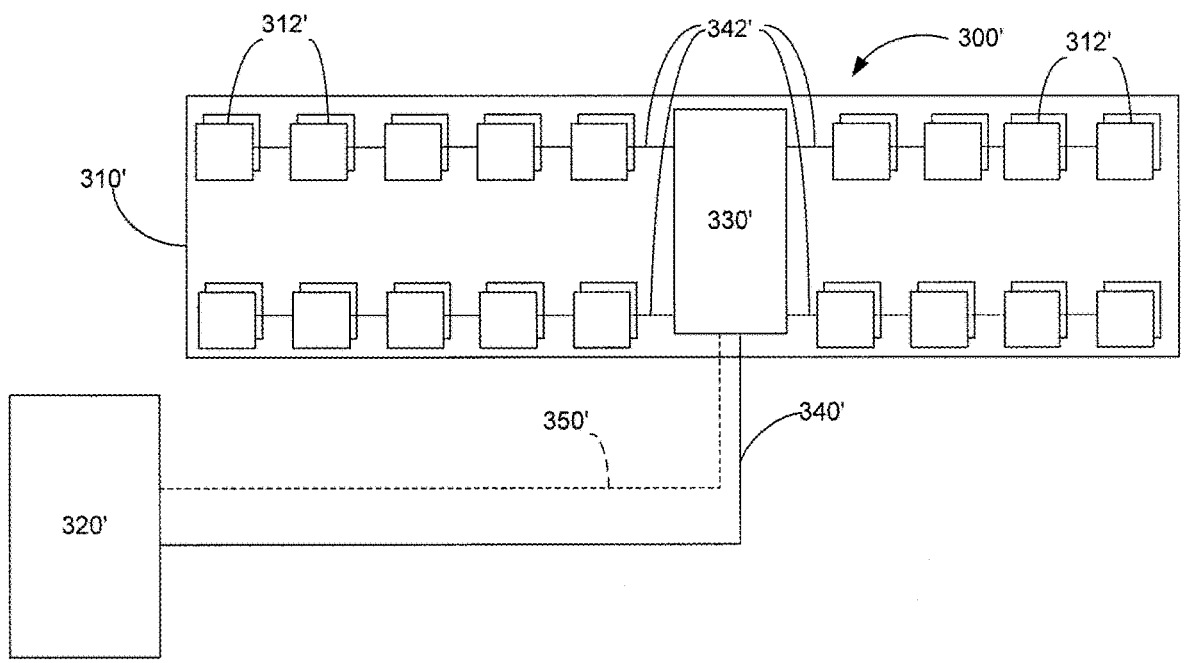

MEMORY MODULE WITH CONTROLLED BYTE-WISE BUFFERS

CROSS-REFERENCE TO RELATED APPLICATIONS

This application is a continuation from U.S. patent application Ser. No. 13/970,606, filed Aug. 20, 2013, to be issued as U.S. Pat. No. 9,606,907, which is a continuation from U.S. patent application Ser. No. 12/761,179, filed Apr. 15, 2010, now U.S. Pat. No. 8,516,185, which is a continuation-in-part from U.S. patent application Ser. No. 12/504,131, filed Jul. 16, 2009, now U.S. Pat. No. 8,417,870, each of which is incorporated in its entirety by reference herein.

BACKGROUND

The present disclosure relates generally to memory subsystems of computer systems, and more specifically to systems, devices, and methods for improving the performance and the memory capacity of memory subsystems or memory "boards," particularly memory boards that include dual in-line memory modules (DIMMs).

Certain types of computer memory subsystems include a plurality of dynamic random-access memory (DRAM) or synchronous dynamic random access memory (SDRAM) devices mounted on a printed circuit board (PCB). These memory subsystems or memory "boards" are typically mounted in a memory slot or socket of a computer system, such as a server system or a personal computer, and are accessed by the processor of the computer system. Memory boards typically include one or more memory modules, each with a plurality of memory devices (such as DRAMs or SDRAMs) in a unique configuration of rows, columns, and banks, which provide a total memory capacity for the memory module.

The memory devices of a memory module are generally arranged as ranks or rows of memory, each rank of memory generally having a bit width. For example, a memory module in which each rank of the memory module is 64 bits wide is described as having an "×64" or "by 64" organization. Similarly, a memory module having 72-bit-wide ranks is described as having an "×72" or "by 72" organization.

The memory capacity of a memory module increases with the number of memory devices. The number of memory devices of a memory module can be increased by increasing the number of memory devices per rank or by increasing the number of ranks. Rather than referring to the memory capacity of the memory module, in certain circumstances, the memory density of the memory module is referred to instead.

During operation, the ranks of a memory module are selected or activated by control signals that are received from the processor. Examples of such control signals include, but are not limited to, rank-select signals, also called chip-select signals. Most computer and server systems support a limited number of ranks per memory module, which limits the memory density that can be incorporated in each memory module.

The memory space in an electronic system is limited by the physical addressable space that is defined by the number of address bits, or by the number of chips selected. In general, once the memory space is defined for an electronic system, it would not be feasible to modify the memory space without an extensive design change. This is especially true for the case in which a memory space is defined by a consortium, such as the Joint Electron Device Engineering Council (JEDEC). A problem arises when a user's application requires a larger addressable memory space than the memory space that the current electronic system is designed to support.

In developing a memory subsystem, consideration is always given to memory density, power dissipation (or thermal dissipation), speed, and cost. Generally, these attributes are not orthogonal to each other, meaning that optimizing one attribute may detrimentally affect another attribute. For example, increasing memory density typically causes higher power dissipation, slower operational speed, and higher costs.

Furthermore, the specifications of the memory subsystem may be guided by physical limitations associated with these attributes. For example, high thermal dissipation may limit the speed of the operation, or the physical size of the memory module may limit the density of the module.

These attributes generally dictate the design parameters of the memory module, usually requiring that the memory system slow down operation speed if the memory subsystem is populated with more memory devices to provide higher density memory cards.

SUMMARY

In certain embodiments, a memory module is configured to communicate with a memory controller of a computer system via a set of control signal lines and a plurality of sets of data signal lines. Each set of the plurality sets of data signal lines is a byte wide. The memory module has a width of, for example, 32 bits, 64 bits, 72 bits, 128 bits, or 256 bits, etc., and comprises a printed circuit board configured to be coupled to the memory controller via the set of control signal lines and the first number of data signal lines. The module board is mountable in a memory socket of the computer system and has an edge connector comprising a plurality of electrical contacts which are positioned on an edge of the PCB and are positioned to be releasably coupled to corresponding contacts of the memory socket. The memory module further comprises memory devices such as double data rate dynamic random access memory (DDR DRAM) devices coupled to the module board and arranged in multiple ranks each of the same width (i.e., N bits) as the memory module. The memory module further comprises a module controller coupled to the module board and operatively coupled to the DDR DRAM devices via a set of registered control lines. The module controller is configured to register input address and control signals for a read or write operation received from the memory controller via the set of address and control signal lines, and to output registered address and control signals onto the set of registered control lines. The read or write operation being targeted at a specific N-bit-wide rank of the multiple N-bit-wide ranks, so that the specific N-bit-wide rank is an only N-bit-wide rank among the multiple N-bit wide ranks selected to perform the read or write operation. The module controller is further configured to output a set of module control signals in response to the input control signals, the set of module control signals including signals that are dependent on which of the multiple N-bit-wide ranks is the specific N-bit-wide rank.

The memory module further comprises a plurality of byte-wise buffers coupled to the circuit board and configured to receive the second module control signals. Each respective byte-wise buffer of the plurality of byte-wise buffers is coupled to a respective set of the plurality of sets of data signal lines and to at least one respective DDR DRAM device in each of the multiple ranks. The plurality of byte-wise buffers are disposed on the module board at respective positions corresponding to respective sets of the plurality of sets of data signal lines. In certain embodiments, each respective byte-wise buffer includes data paths and logic controlling the data paths in response to the second module control signals so that each respective byte-wise buffer is configured to actively drive a respective byte-wise section of each N-bit wide data signal associated with the read or write operation between the respective set of the plurality of sets of data signal lines and the at least one respective DDR DRAM device in the specific N-bit-wide rank. In certain embodiments, the each respective byte-wise buffer includes configurable data paths and logic that configures the data paths in response to the second module control signals so as to enable a respective byte-wise section of each N-bit wide data signal associated with the read or write operation be communicated between the memory controller and the at least one respective DDR DRAM device in the specific N-bit-wide rank. The logic configures the data paths differently depending on which of the multiple N-bit-wide ranks is performing the read or write operation.

In certain embodiments, the byte-wise buffers are configured to present to the memory controller one DDR DRAM device load on each data line of the plurality of sets of data lines during a write operation. In certain embodiments, the control circuit controls the byte-wise buffers in accordance with a CAS latency parameter.

BRIEF DESCRIPTION OF THE DRAWINGS

A complete understanding of the present invention may be obtained by reference to the accompanying drawings, when considered in conjunction with the subsequent, detailed description, in which:

FIG. 1A is a schematic representation of a conventional memory subsystem populated with at least one JEDEC-standard two-rank memory module;

FIG. 1B is a schematic representation of a conventional memory subsystem populated with at least one JEDEC-standard four-rank memory module.

FIG. 2A is a schematic representation of another conventional memory subsystem populated with at least one two-rank memory module.

FIG. 2B is a schematic representation of another conventional memory subsystem populated with at least one four-rank memory module.

FIGS. 2C and 2D schematically illustrate a conventional two-rank memory module and a four-rank memory module, respectively, each comprising a memory buffer.

For purposes of clarity and brevity, like elements and components bear like designations and numbering throughout the figures.

DETAILED DESCRIPTION

Figure 3A:
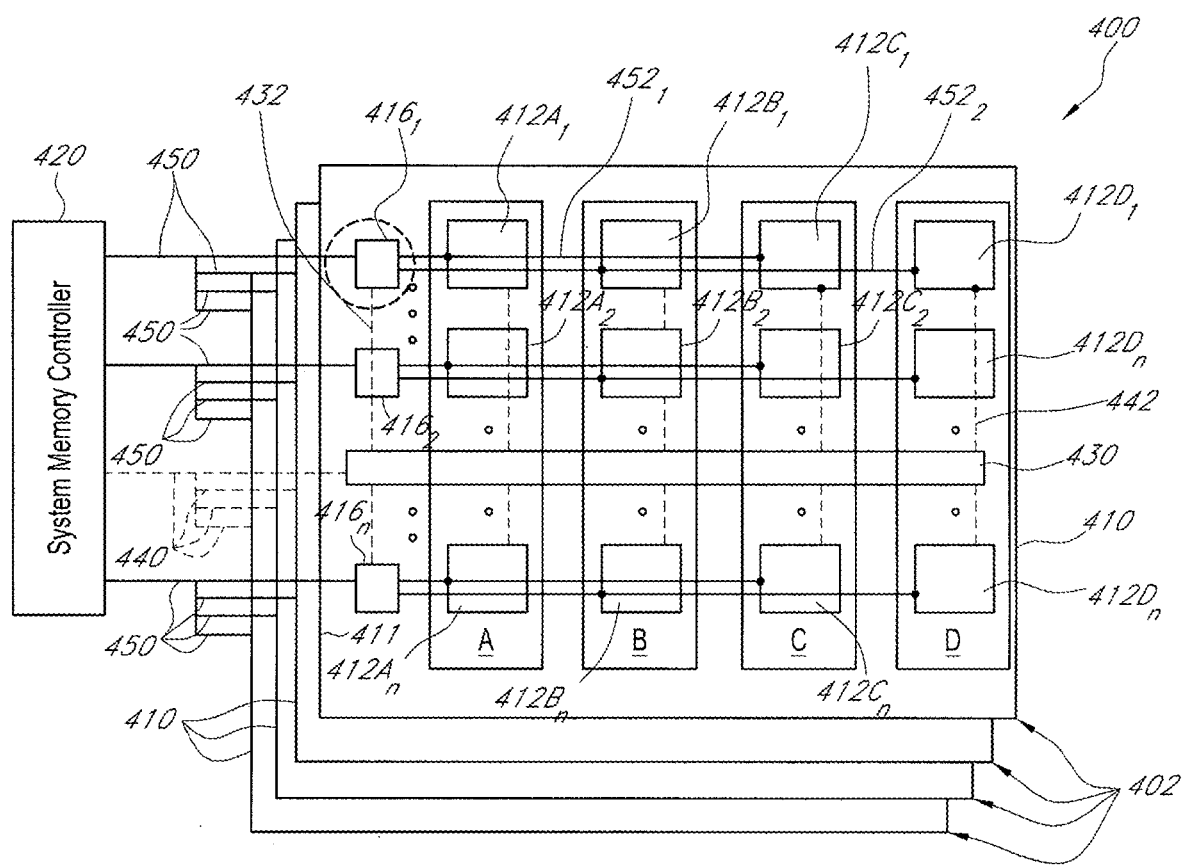
FIG. 3A is a schematic representation of an example memory subsystem in accordance with an embodiment of the disclosure.

One method for increasing memory space is based on an address decoding scheme. This method is very widely adopted in the electronics industry in designing Application-Specific Integrated Circuit (ASIC) and System-On-Chip (SOC) devices to expand system memories. Another method increases the addressable memory space without extensive alteration of the software or hardware of an existing electronics system. This method combines chip-select signals with an address signal to increase the number of physically addressable memory spaces (e.g., by a factor of 2, by a factor of 4, by a factor of 8, or by other factors as well).

These methods have several shortcomings. For example, since these methods increase the addressable memory space by directly adding memory chips, a heavier load is presented to the outputs of the system controller and the outputs of the memory devices, resulting in a slower system. Also, increasing the number of memory devices results in higher power dissipation. In addition, since an increase in the number of memory devices on each memory module alters the physical properties of the memory module while the system board remains the same, the overall signal (transmission line) wave characteristics deviate from the original design intent or specification. Furthermore, especially when registered DIMMs (RDIMMs) are used, the increase in the number of the memory devices translates to an increase in the distributed RC load on the data paths, but not on the control paths (e.g., address paths), thereby introducing uneven signal propagation delay between the data signal paths and control signal paths. As used herein, the terms "control lines" and "control paths" include address lines or paths and command lines or paths, and the term "control signals" includes address signals and command signals.

FIGS. 1A and 1B illustrate a prior art approach of increasing the number of memory devices. Specifically, FIG. 1A shows a conventional memory subsystem 100 with at least one JEDEC-standard two-rank memory module 110, such as a registered dual inline memory module (RDIMM), only one of which is shown for clarity. Each rank of the memory module 110 comprises a plurality of memory devices 112, such as dynamic random access memory (DRAM) devices or synchronous DRAM (SDRAM) devices. A register 130 receives a plurality of control lines 140 (shown as a single solid line) from the system memory controller 120 and is connected via control lines 142 to the memory devices 112 of each rank of the memory module 110. This memory subsystem 100 connects each data line of an array of data lines 150 (shown as dashed lines) from a system memory controller 120 to corresponding memory devices 112 in the two ranks in each memory module 110. Therefore, during a write operation, the system memory controller 120 sees all the memory devices 112 as its load via the data lines 150, and during a read operation, each memory device 112 sees multiple other memory devices 112, as well as the system memory controller 120, as its load via the data lines 150.

FIG. 1B is a schematic view of another conventional memory subsystem 100' with at least one JEDEC-standard four-rank memory module 110' (only one of which is shown for clarity), each rank comprising a plurality of memory devices 112'. The register 130' receives the plurality of control lines 140' (shown as a single solid line) from the system memory controller 120' and is connected via control lines 142' to the memory devices 112' of each rank of the memory module 110'. Each data line of the array of data lines 150' (shown as dashed lines) from the system memory controller 120' is connected (e.g., by four fanouts) to corresponding memory devices 112' in the four ranks in each memory module 110'. Therefore, as with the two-rank memory module 110 shown in FIG. 1A, during a write operation, the system memory controller 120' sees all the memory devices 112' as its load via the data lines 150', and during a read operation, each memory device 112' sees multiple other memory devices 112' and the system memory controller 120' as its load via the data lines 150'.

For both the conventional two-rank memory module 110 and the conventional four-rank memory module 110', the multiple loads seen by the memory controller 120, 120' during write operations and the multiple loads seen by the memory devices 112, 112' during read operations cause significant performance issues. For example, for synchronous operation, time delays of the various signals are desired to be substantially equal to one another such that the operation of the memory module 110, 110' is synchronized with the system bus of the computer system. Thus, the trace lengths of the memory module 110, 110' are selected such that the signals are at the same clock phase. For example, the lengths of the control lines 142, 142' from the register 130, 130' to each of the memory devices 112, 112' are substantially equal to one another. However, for faster clock speeds, small errors in the trace lengths make such synchronous operation difficult or impossible. Therefore, these prior art techniques not only reduce the speed of the memory systems, but they also require hardware modifications to minimize any deviation of the transmission line wave characteristics from the original design specification.

FIGS. 2A and 2B illustrate another prior art approach of increasing the number of memory devices. Specifically, FIG. 2A shows a conventional memory subsystem 200 with at least one two-rank memory module 210, only one of which is shown for clarity. Each rank of the memory module 210 comprises a plurality of memory devices 212, such as dynamic random access memory (DRAM) devices or synchronous DRAM (SDRAM) devices. A register 230 receives a plurality of control lines 240 (shown as a single solid line) from the system memory controller 220 and is connected via control lines 242 to the memory devices 212 of each rank of the memory module 210. This memory subsystem 200 connects each data line of an array of data lines 250 (shown as dashed lines) from a system memory controller 220 to corresponding memory devices 212 in the two ranks in each memory module 210. Therefore, during a write operation, the system memory controller 220 sees all the memory devices 212 as its load via the data lines 250, and during a read operation, each memory device 212 sees multiple other memory devices 212, as well as the system memory controller 220, as its load via the data lines 250.

FIG. 2B is a schematic view of another conventional memory subsystem 200' with at least one four-rank memory module 210' (only one of which is shown for clarity), each rank comprising a plurality of memory devices 212'. The register 230' receives the plurality of control lines 240' (shown as a single solid line) from the system memory controller 220' and is connected via control lines 242' to the memory devices 212' of each rank of the memory module 210'. Each data line of the array of data lines 250' (shown as dashed lines) from the system memory controller 220' is connected (e.g., by four fanouts) to corresponding memory devices 212' in the four ranks in each memory module 210'. Therefore, as with the two-rank memory module 210 shown in FIG. 2A, during a write operation, the system memory controller 220' sees all the memory devices 212' as its load via the data lines 250', and during a read operation, each memory device 212' sees multiple other memory devices 212' and the system memory controller 220' as its load via the data lines 250'.

For the memory modules 210, 210', the control lines 242, 242' have a "flyby" configuration. In such a configuration, control signals are sent along the control lines 242, 242' (e.g., in a single-path daisy-chain) from the register 230, 230' to the memory devices 212, 212' of a given rank. These control signals reach each memory device 212, 212' of the rank sequentially, with the control signals first reaching the memory device 212, 212' having the shortest control line 242, 242', then reaching the memory device 212, 212' having the next-shortest control line 242, 242', and so on. For example, a control signal may reach the memory device 212, 212' having the longest control line 242, 242' a significant period of time after the same control signal reaches the memory device 212, 212' having the shortest control line 242, 242'. For synchronous operation, the memory subsystems 200, 200' have the data lines 250, 250' configured so that the time delays of the various data signals between the memory controller 220, 220' and the particular memory devices 212, 212' are substantially tailored such that the data signals and the control signals reach the particular memory device 212, 212' so that operation of the memory module 210, 210' is synchronized with the system bus of the computer system. Such "fly-by" configurations have been described as operating in "local sync" while having "global async."

For such "fly-by" configurations, the memory controller 220, 220' of FIGS. 2A and 2B is more complicated than the memory controller 120, 120' of FIGS. 1A and 1B in that the memory controller 220, 220' accounts for the time delays between the various memory devices 212, 212' and adjusts the timing of these signals appropriately for synchronous operation. However, in some situations, the clock cycle time is approximately equal to or less than the time difference (e.g., about 900 picoseconds) between the control signals reaching the memory device 212, 212' having the longest control line 242, 242' and reaching the memory device 212, 212' having the shortest control line 242, 242'. Under such situations, synchronous operation is not achievable. Thus, the time difference between the control signals reaching the memory devices 212, 212' at the extremes of the control lines 242, 242' provide a limit to the clock speed with which the memory module 210, 210' may be operated. These time differences, which can be more than one clock cycle, will limit the operational speed and performance of the memory module. In addition, as with the memory subsystems 100, 100' of FIGS. 1A and 1B, the "fly-by" memory subsystems 200, 200' of FIGS. 2A and 2B suffer from large loads which result in slower clock speeds.

One recent suggestion for the "fly-by" configurations is to provide a memory buffer which handles both the control signals and the data signals. FIGS. 2C and 2D schematically illustrate a conventional two-rank memory module 310 and a four-rank memory module 310', respectively, each comprising a memory buffer 330, 330'. The control lines 340, 340' provide conduits for control signals from the memory controller 320, 320' to the memory buffer 330, 330', and the control lines 342, 342' provide conduits for control signals from the memory buffer 330, 330' to the memory devices 312, 312'. The plurality of data lines 350, 350' (shown as one dashed line for clarity) provide conduits for data signals from the memory controller 320, 320' to the memory buffer 330, 330', and data lines (not shown for clarity) on the memory module 310, 310' provide conduits for data signals from the memory controller 320, 320' to the memory devices 312, 312'.

The configurations of FIGS. 2C and 2D seek to have both the data signals and the control signals going to the memory buffer 330, 330'. However, such configurations have significant drawbacks. To send the data signals to the various memory devices 312, 312', the memory module 310, 310' includes an extremely large number of data lines (not shown for clarity) coupling the memory buffer 330, 330' to the memory devices 312, 312'. For example, in certain circumstances, the memory buffer 330, 330' for an LRDIMM is a 628-pin device, which is extremely large. In addition, the logistics of tailoring the time delays of these many data lines is complicated or difficult to provide the desired timing of data signals from the memory buffer 330, 330' to the memory devices 312, 312'. Also, the memory module 310, 310' utilizes significant modifications of the memory controller 320, 320' since the memory buffer 330, 330' is taking over some of the control of data signal timing that conventional memory controllers have. Even so, the memory modules 310, 310' of FIGS. 2C and 2D can only operate in asynchronous mode, not synchronous mode, due to the long fly-by times as compared to the desired clock frequencies. For example, for a fly-by delay of 1 nanosecond, if the data rate is 1 Gb/second, there is the possibility of collisions on the data lines during read/write turnaround. To combat such collisions, the data rate can be slowed down or "dead" cycles can be inserted. The memory module 310, 310', as a single unit, cannot be operated in synchronous mode, but operates as locally synchronous, globally (DIMM level) asynchronous.

Figure 3B:
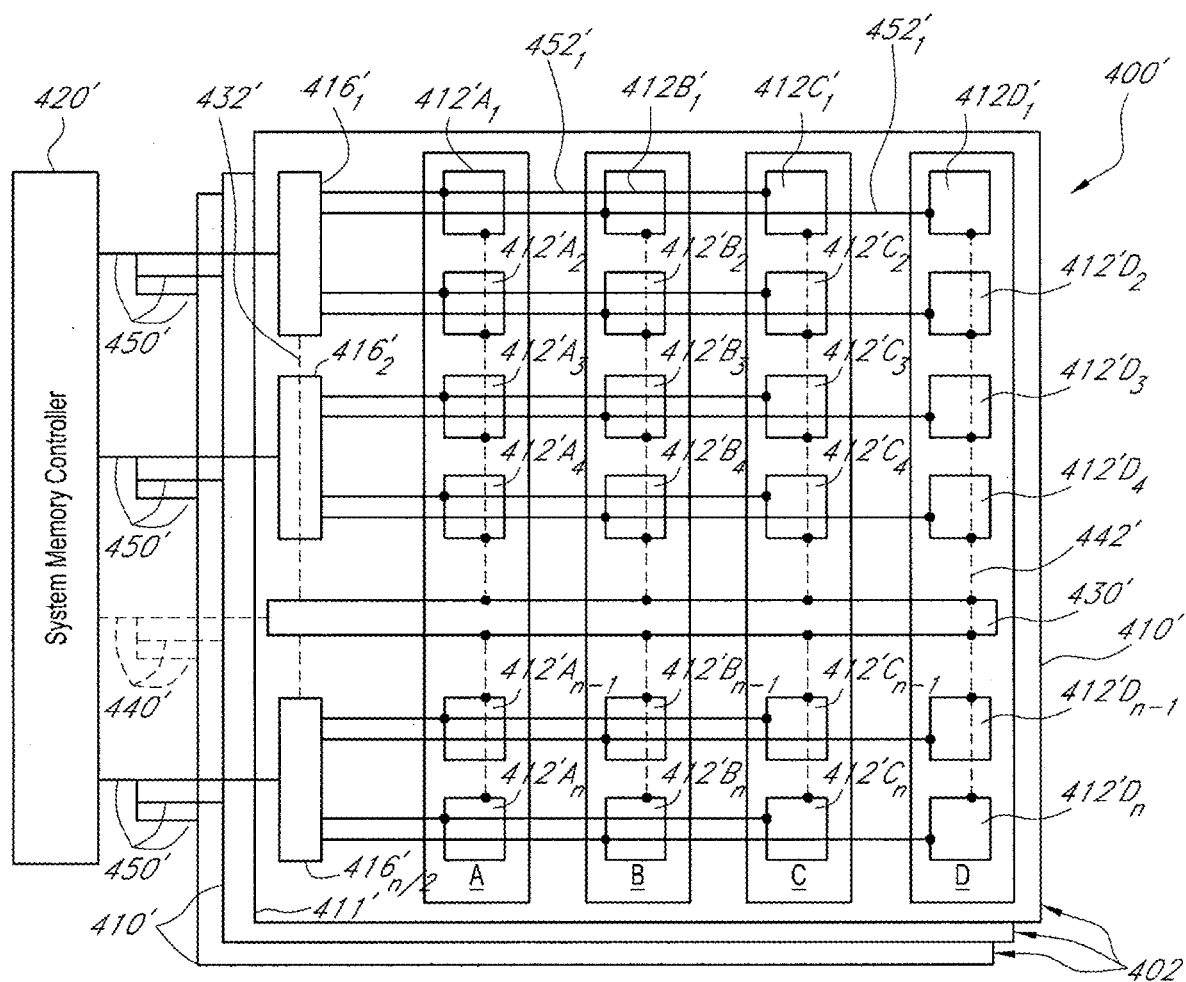
FIG. 3B schematically illustrates another example memory subsystem in accordance with certain embodiments described herein.
Figure 3C:
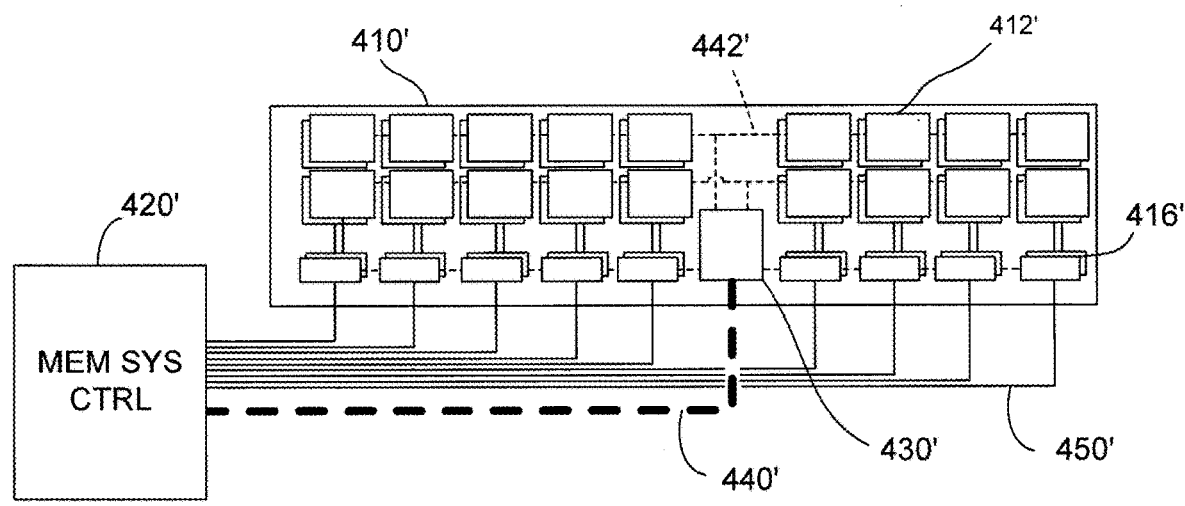
FIG. 3C schematically illustrates an example layout of the memory devices, the data transmission circuits, and the control circuit of a memory module in accordance with certain embodiments described herein.
Figure 3D:
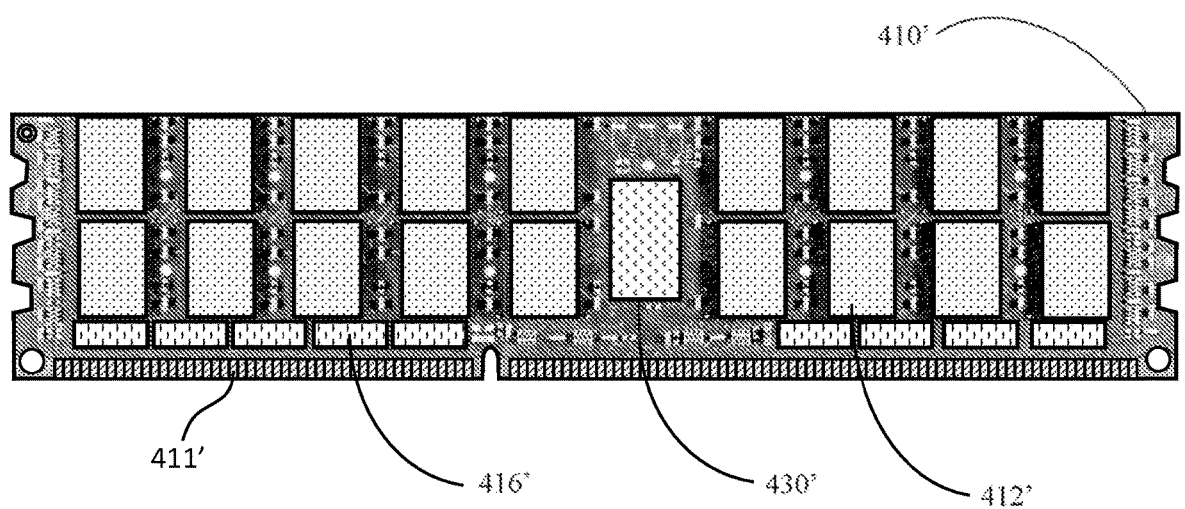
FIG. 3D is a photograph of an example memory subsystem in accordance with certain embodiments described herein.

FIG. 3A schematically illustrates an example memory subsystem 400 with loadreduced memory modules 402 in accordance with certain embodiments described herein. FIG. 3B schematically illustrates another example memory subsystem 400' with loadreduced memory modules 402' in accordance with certain embodiments described herein. FIG. 3C schematically illustrates an example layout of the memory devices 412', the data transmission circuits 416', and the control circuit 430' of a memory module 402' in accordance with certain embodiments described herein. FIG. 3D is a photograph of an example memory subsystem in accordance with certain embodiments described herein. In FIGS. 3A-3C, control lines (e.g., address and control lines 440, 440' coupling the system memory controller 420, 420' to the memory modules 410, 410') are shown as dashed lines, data lines (e.g., data lines 450, 450' coupling the system memory controller 420, 420' to the memory modules 410, 410') are shown as solid lines, and in FIGS. 3A and 3B, input/output connections are shown as black dots. In certain embodiments, as schematically illustrated by FIGS. 3A-3C, the address and control lines 440, 440' coupling the system memory controller 420, 420' to the memory module 410, 410' (e.g., to the control circuit 430, 430') are separate from the data lines 450, 450' coupling the system memory controller 420, 420' to the memory module 410, 410' (e.g., to the data transmission circuits 416, 416'). In certain embodiments, the memory subsystem 400, 400' is designed, for example, to deliver higher speed and higher memory density with lower thermal dissipation as compared with conventional memory subsystems. In the following discussion, aspects of the example subsystem 400 and corresponding components (e.g., memory modules 402, memory devices 412A, 412B, 412C, 412D, data transmission circuits 416, control circuit 430) and of the example subsystem 400' and corresponding components (e.g., memory modules 402', memory devices 412'A$_1$, 412'A$_2$, 412'B$_1$, 412'B$_2$, 412'C$_1$, 412'C$_2$, 412'D$_1$, 412'D$_2$, data transmission circuits 416', control circuit 430') should be understood to apply to certain other embodiments as well.

As schematically illustrated in FIGS. 3A and 3B, the example memory module 402, 402' comprises at least one printed circuit board 410, 410' and a plurality of memory devices 412, 412' mechanically coupled to the at least one printed circuit board 410, 410'. The memory module 402, 402' further comprises a control circuit 430, 430' mechanically coupled to the at least one printed circuit board 410, 410'. The control circuit 430, 430' is configurable to receive control signals from the system memory controller 420, 420' and to transmit module control signals to the plurality of memory devices 412, 412'. The memory module 402, 402' further comprises a plurality of data transmission circuits 416, 416' mechanically coupled to the at least one printed circuit board 410, 410' and distributed at corresponding positions relative to the at least one printed circuit board 410, 410'. The plurality of data transmission circuits 416, 416' is configurable to be operatively coupled to the system memory controller 420, 420' and configurable to receive module control signals from the control circuit 430, 430'. At least one first data transmission circuit of the plurality of data transmission circuits 416, 416' is operatively coupled to at least two memory devices of the plurality of memory devices 412, 412'. At least one second data transmission circuit of the plurality of data transmission circuits 416, 416' is operatively coupled to at least two memory devices of the plurality of memory devices 412, 412'. The at least one first data transmission circuit is configurable to respond to the module control signals by selectively allowing or inhibiting data transmission between the system memory controller 420, 420' and at least one selected memory device of the at least two memory devices operatively coupled to the at least one first data transmission circuit. The at least one second data transmission circuit is configurable to respond to the module control signals by selectively allowing or inhibiting data transmission between the system memory controller 420, 420' and at least one selected memory device of the at least two memory devices operatively coupled to the at least one second data transmission circuit.

As shown in FIGS. 3A and 3B, the memory subsystem 400, 400' is configurable to be operationally coupled to a system memory controller 420, 420', of a type well-known in the art (e.g., Intel Nehalem EP, EX chipsets; AM D Opteron chipset). The memory subsystem 400, 400' typically comprises one or more memory modules 402, 402', such as DIMMs or RDIMMs, additional details of which are shown only for one for clarity. Various types of memory modules 402, 402' are compatible with embodiments described herein. For example, memory modules having memory capacities of 512 MB, 1 GB, 2 GB, 4 GB, 8 GB, as well as other capacities, are compatible with embodiments described herein. In addition, memory modules having widths of 4 bytes, 8 bytes, 9 bytes, 16 bytes, 32 bytes, or 32 bits, 64 bits, 72 bits, 128 bits, 256 bits, as well as other widths (in bytes or in bits), are compatible with embodiments described herein. Furthermore, memory modules 402, 402' compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), fully-buffered DIMMs (FBDIMMs), mini-DIMMs, and micro-DIMMs.

The one or more memory modules 402, 402' comprise one or more printed circuit boards (PCBs) 410, 410', which may be arranged in a vertical stack (as shown), or in a back-to-back array. Each memory module 402, 402' in certain embodiments comprises a single PCB 410, 410', while in certain other embodiments, each of one or more of the memory modules 402 comprises multiple PCBs 410, 410'. In some embodiments, the PCBs 410, 410' are mountable in module slots (not shown) of the computer system. A PCB 410, 410' of certain such embodiments has at least one edge connector 411 comprising a plurality of electrical contacts which are positioned on an edge of the PCB 410, 410' (as shown in FIG. 3d) and are configured to be releasably coupled to corresponding contacts of a computer system socket to provide electrical conductivity between the system memory controller 420, 420' and the various components of the memory modules 402, 401' on the PCBs 410, 410'.

At least one memory module 402, 402' comprises a plurality of memory devices 412, 412' (such as DRAMs or SDRAMs). The memory devices 412, 412' of the memory module 402, 402' may advantageously be arranged in a plurality of rows or ranks. Memory devices 412, 412' compatible with embodiments described herein include, but are not limited to, random-access memory (RAM), dynamic random-access memory (DRAM), synchronous DRAM (SDRAM), and double-data-rate DRAM (e.g., DDR, DDR2, DDR3, etc.). In addition, memory devices 412, 412' having bit widths of 4, 8, 16, 32, as well as other bit widths, are compatible with embodiments described herein. Memory devices 412, 412' compatible with embodiments described herein have packaging which include, but are not limited to, thin small-outline package (TSOP), ball-grid-array (BGA), fine-pitch BGA (FBGA), micro-BGA (OGA), mini-BGA (mBGA), and chip-scale packaging (CSP).

In certain embodiments, the memory devices 412, 412' of the memory module 402, 402' are arranged in four ranks, although embodiments with less than four ranks (e.g., one rank, two ranks, three ranks) or more than four ranks (e.g., 6 ranks, 8 ranks) per memory module 402, 402' may be employed. In certain embodiments, each rank comprises eight or nine memory modules, while in certain other embodiments, other numbers of memory modules per rank may also be used. In certain embodiments, as schematically shown in FIG. 3A, the memory devices 412 are arranged in four ranks, denoted A, B, C, and D, and each rank comprises n memory devices. For the sake of this disclosure, in the example memory subsystem 400 of FIG. 3A, rank A comprises memory devices $412A_1, 412A_2, \ldots, 412A_n$; rank B comprises memory devices $412B_1, 412B_2, \ldots, 412B_n$; rank C comprises memory devices $412C_1, 412C_2, \ldots, 412C_n$; and rank D comprises memory devices $412D_1, 412D_2, \ldots, 412D_n$. For the sake of this disclosure, in the example memory subsystem 400' of FIG. 3B, rank A comprises memory devices $412'A_1, 412'A_2, \ldots, 412'A_n$; rank B comprises memory devices $412'B_1, 412'B_2, \ldots, 412'B_n$; rank C comprises memory devices $412'C_1, 412'C_2, 412'C_n$; and rank D comprises memory devices $412'D_1, 412'D_2, \ldots, 412'D_n$.

In certain embodiments, at least one memory module 402, 402' comprises one or more electrical components (not shown) which may be mounted on the PCB 410, 410', within the PCB 410, 410', or both on and within the PCB 410, 410', and are operationally coupled to one another and to the plurality of memory devices 412, 412'. For example, the electrical components may be surface-mounted, through-hole mounted, embedded or buried between layers of the PCB 410, 410', or otherwise connected to the PCB 410, 410'. These electrical components may include, but are not limited to, electrical conduits, resistors, capacitors, inductors, transistors, buffers, registers, logic elements, or other circuit elements. In certain embodiments, at least some of these electrical components are discrete, while in other certain embodiments, at least some of these electrical components are constituents of one or more integrated circuits.

In certain embodiments, at least one memory module 402, 402' comprises a control circuit 430, 430' configured to be operatively coupled to the system memory controller 420, 420' and to the memory devices 412, 412' of the memory module 402, 402' (e.g., via lines 442, 442'). In certain embodiments, the control circuit 430, 430' may include one or more functional devices, such as a programmable-logic device (PLD), an applicationspecific integrated circuit (ASIC), a field-programmable gate array (FPGA), a customdesigned semiconductor device, or a complex programmable-logic device (CPLD). In certain embodiments, the control circuit 430, 430' may comprise one or more custom devices. In certain embodiments, the control circuit 430, 430' may comprise various discrete electrical elements; while in other embodiments, the control circuit 430, 430' may comprise one or more integrated circuits.

The control circuit 430, 430' of certain embodiments is configurable to be operatively coupled to control lines 440, 440' to receive control signals (e.g., bank address signals, row address signals, column address signals, address strobe signals, and rank-address or chip-select signals) from the system memory controller 420, 420'. The control circuit 430, 430' of certain embodiments registers signals from the control lines 440, 440' in a manner functionally comparable to the address register of a conventional RDIMM. The registered control lines 440, 440' are also operatively coupled to the memory devices 412, 412'. Additionally, the control circuit 430, 430' supplies control signals for the data transmission circuits 416, 416' (e.g., via lines 432, 432'), as described more fully below. The control signals indicate, for example, the direction of data flow, that is, to or from the memory devices 412, 412'. The control circuit 430, 430' may produce additional chip-select signals or output enable signals based on address decoding. Examples of circuits which can serve as the control circuit 430, 430' are described in more detail by U.S. Pat. Nos. 7,289,386 and 7,532,537, each of which is incorporated in its entirety by reference herein.

In certain embodiments, at least one memory module 402, 402' comprises a plurality of data transmission circuits 416, 416' mounted on the one or more PCBs 410, 410', within the one or more PCBs 410, 410', or both on and within the one or more PCBs 410, 410'. The plurality of data transmission circuits 416, 416' are operatively coupled to the control circuit 430, 430' (e.g., via lines 432, 432'), and configured to be operatively coupled to the system memory controller 420, 420' (e.g., via the data lines 450, 450') upon operatively coupling the memory module 402, 402' to the computer system. In certain embodiments, these data transmission circuits 416, 416' can be referred to as "load-reducing circuits" or "load-reducing switching circuits." As used herein, the terms "load-reducing" or "load-reducing switching" refer to the use of the data transmission circuits 416, 416' to reduce the load seen by the system memory controller 420, 420' when operatively coupled to the memory module 402, 402'. In certain embodiments, as schematically illustrated by FIG. 3A, the memory module 402 comprises n data transmission circuits 416, where n is the number of memory devices per rank of the memory module 410. For example, as schematically shown in FIG. 3A, the memory devices 412 of the memory module 410 are arranged in four ranks of n memory devices each, and the memory module 410 comprises at least a first data transmission circuit $416_1$ and a second data transmission circuit $416_2$. The first data transmission circuit $416_1$ of certain such embodiments is operatively coupled to at least one memory device 412 of each rank (e.g., memory devices $412A_1$, $412B_1$, $412C_1$, $412D_1$). The second data transmission circuit $416_2$ of certain such embodiments is operatively coupled to at least one memory device 412 of each rank (e.g., memory devices $412A_2$, $412B_2$, $412C_2$, $412D_2$). In certain embodiments, as schematically illustrated by FIG. 3B, the memory module 402' comprises n/2 data transmission circuits 416', where n is the number of memory devices per rank of the memory module 410'. For example, as schematically shown in FIG. 3B, the memory devices 412' of the memory module 410' are arranged in four ranks of n memory devices each, and the memory module 410' comprises at least a first data transmission circuit $416_1$ and a second data transmission circuit 416'2. The first data transmission circuit $416_1$ of certain such embodiments is operatively coupled to at least two memory devices 412' of each rank (e.g., memory devices $412A_1$, $412A_2$, $412B_1$, $412B_2$, $412C_1$, $412C_2$, $412D_1$, $412D_2$). The second data transmission circuit $416_2$ of certain such embodiments is operatively coupled to at least two memory devices 412' of each rank (e.g., memory devices $412'A_3$, $412'A_4$, $412'B_3$, $412'B_4$, $412'C_3$, $412'C_4$, $412'D_3$, $412'D_4$). In certain embodiments, at least one data transmission circuit 416, 416' selectively switches between two or more memory devices 412, 412' so as to operatively couple at least one selected memory device 412, 412' to the system memory controller 420, 420' (e.g., the data transmission circuit 416, 416' is configurable to respond to module control signals by selectively allowing or inhibiting data transmission between the system memory controller 420, 420' and at least one selected memory device 412, 412').

In certain such embodiments, the at least one data transmission circuit 416, 416' selectively operatively couples two selected memory devices to the system memory controller 420, 420'. For example, as schematically shown in FIG. 3A, the first data transmission circuit $416_1$ is configurable to respond to module control signals by selectively allowing or inhibiting data transmission between the system memory controller 420 and either selected memory devices $412A_1$ and $412C_1$ or selected memory devices $412B_1$ and $412D_1$), and the second data transmission circuit $416_2$ is configurable to respond to module control signals by selectively allowing or inhibiting data transmission between the system memory controller 420 and either selected memory devices $412A_2$ and $412C_2$ or selected memory devices $412B_2$ and $412D_2$). Conversely, in a conventional memory module without the data transmission circuits 416, the two or more memory devices 412 (e.g., memory devices $412A_1$, $412B_1$, $412C_1$, $412D_1$) are concurrently operatively coupled to the system memory controller 420. A data transmission circuit 416 of certain embodiments bidirectionally buffer data signals between the memory controller 420 and the memory devices 412 corresponding to the data transmission circuit 416. For another example, as schematically shown in FIG. 3B, the first data transmission circuit $416'_1$ is configurable to respond to module control signals by selectively allowing or inhibiting data transmission between the system memory controller 420' and either selected memory devices $412'A_1$ and $412'C_1$ or selected memory devices $412'B_1$ and $412'D_1$ and either selected memory devices $412'A_2$ and $412'C_2$ or selected memory devices $412'B_2$ and $412'D_2$), and the second data transmission circuit $416'_2$ is configurable to respond to module control signals by selectively allowing or inhibiting data transmission between the system memory controller 420' and either selected memory devices $412'A_3$ and $412'C_3$ or selected memory devices $412'B_3$ and $412'D_3$ and either selected memory devices $412'A_4$ and $412'C_4$ or selected memory devices $412'B_4$ and $412'D_4$).

In certain embodiments, two or more of the data transmission circuits 416, 416' are mechanically coupled to the at least PCB 410, 410' at corresponding positions which are separate from one another. For example, as schematically illustrated by FIG. 3A, the first data transmission circuit $416_1$ and the second data transmission circuit $416_2$ are at corresponding positions which are separate from one another (e.g., the package containing the first data transmission circuit $416_1$ is at a location spaced from the location of the package containing the second data transmission circuit $416_2$). For another example, as schematically illustrated by FIG. 3B, the first data transmission circuit $416'_1$ and the second data transmission circuit $416'_2$ are at corresponding positions which are separate from one another (e.g., the package containing the first data transmission circuit $416'_1$ is at a location spaced from the location of the package containing the second data transmission circuit $416'_2$). In certain such embodiments, two or more of the data transmission circuits 416, 416' are distributed across a surface of the PCB 410, 410' of the memory module 402, 402'. In certain embodiments, the corresponding positions of two or more data transmission circuits 416, 416' (e.g., first data transmission circuit $416_1$ and second data transmission circuit $416_2$ of FIG. 3A or first data transmission circuit $416'_1$ and second data transmission circuit $416'_2$ of FIG. 3B) are along an edge 411, 411' of the at least one PCB 410, 410' such that a data transmission circuit 416, 416' is located substantially between the edge 411, 411' and at least some of the at least two memory devices 412, 412' to which the data transmission circuit 416, 416' is operatively coupled. For example, as schematically illustrated by FIG. 3A, the first data transmission circuit $416_1$ is located substantially between the edge 411 and the memory devices $412A_1$, $412B_1$, $412C_1$, $412D_1$ to which the first data transmission circuit $416_1$ is operatively coupled, and the second data transmission circuit $416_2$ is located substantially between the edge 411 and the memory devices $412A_2$, $412B_2$, $412C_2$, $412D_2$ to which the second data transmission circuit $416_1$ is operatively coupled. For another example, as schematically illustrated by FIG. 3B, the first data transmission circuit $416'_1$ is located substantially between the edge 411' and the memory devices $412'A_1$, $412'A_2$, $412'B_1$, $412'B_2$, $412'C_1$, $412'C_2$, $412'D_1$, $412'D_2$ to which the first data transmission circuit $416'_1$ is operatively coupled, and the second data transmission circuit $416'_2$ is located substantially between the edge 411' and the memory devices $412'A_3$, $412'A_4$ $412'B_3$, $412'B_4$, $412'C_3$, $412'C_4$, $412'D_3$, $412'D_4$ to which the second data transmission circuit $416'_2$ is operatively coupled.

FIGS. 3C and 3D illustrate the positioning of the data transmission circuits 416' in accordance with certain embodiments described herein. In certain embodiments, the position of at least one of the data transmission circuits 416' is generally aligned with one or more of the memory devices 412' to which the data transmission circuit 416' is operatively coupled. For example, the one or more of the data transmission circuits 416' and the memory devices 412' to which it is operatively coupled can be positioned generally along a line that is substantially perpendicular to the edge 411' of the PCB 410'. In certain embodiments, the position of at least one of the data transmission circuits 416' is generally offset from a line defined by the positions of the one or more of the memory devices 412' to which the data transmission circuit 416' is operatively coupled. For example, as shown in FIGS. 3C and 3D, the memory devices 412' operatively coupled to a data transmission circuit 416' can be positioned along a line that is substantially perpendicular to the edge 411' of the PCB 410' and the data transmission circuit 416' can be generally offset from this line in a direction generally along the edge 411' of the PCB 410'. In certain such embodiments, the data transmission circuits 416' are sufficiently small in width and breadth (e.g., 2.5 mm by 7.5 mm) to fit between the edge 411' and the corresponding memory devices 412' while maintaining the desired size of the memory module 400'. Other positions and sizes of the separate data transmission circuits 416' are also compatible with certain embodiments described herein. For example, in certain embodiments, one or more of the data transmission circuits 416, 416' can be positioned between two or more memory devices 412, 412', or can be spaced away from an edge 411, 411' of the PCB 410, 410' with one or more memory devices 412, 412' between the edge 411, 411' and the one or more data transmission circuits 416, 416'.

Figure 4A:
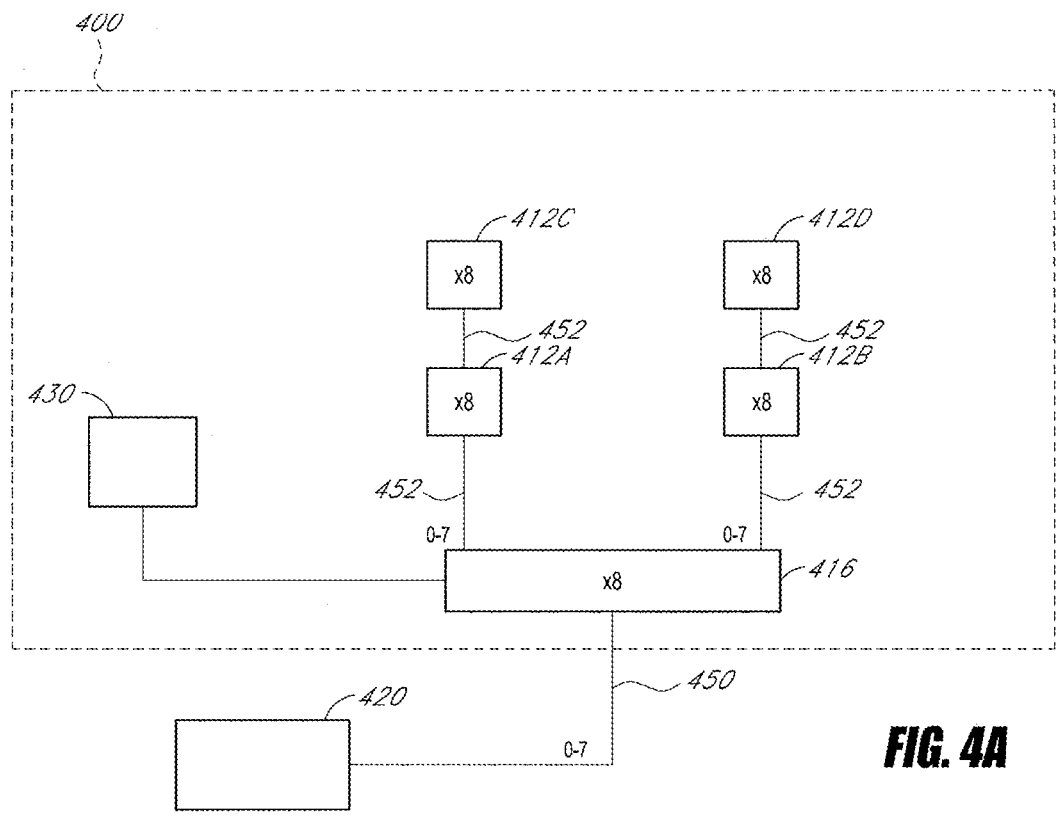
FIG. 4A schematically illustrates an example memory subsystem comprising a data transmission circuit with a bit width which is the same as that of the individual memory devices.

In certain embodiments, the data transmission circuit 416 comprises or functions as a byte-wise buffer. In certain such embodiments, each of the one or more data transmission circuits 416 has the same bit width as does the associated memory devices 412 per rank to which the data transmission circuit 416 is operatively coupled. For example, as schematically illustrated by FIG. 4A (which corresponds generally to FIG. 3A), the data transmission circuit 416 can be operatively coupled to a single memory device 412 per rank, and both the data transmission circuit 416 and the memory device 412 per rank to which the data transmission circuit 416 is operatively coupled can each have the same bit width (e.g., 4 bits, 8 bits, or 16 bits). The data transmission circuit 416 of FIG. 4A has a bit width of 8 bits, and receives data bits 0-7 from the system memory controller 420 and selectively transmits the data bits 0-7 to selected memory devices 412A, 412B, 412C, 412D in response to the module control signals from the control circuit 430. Similarly, data transmission circuits 416' of certain embodiments can function as a byte-wise buffer for associated memory devices 412'A, 412'B, 412'C, 412'D to which the data transmission circuits 416' are operatively coupled in response to the module control signals from the control circuit 430'.

Figure 4B:
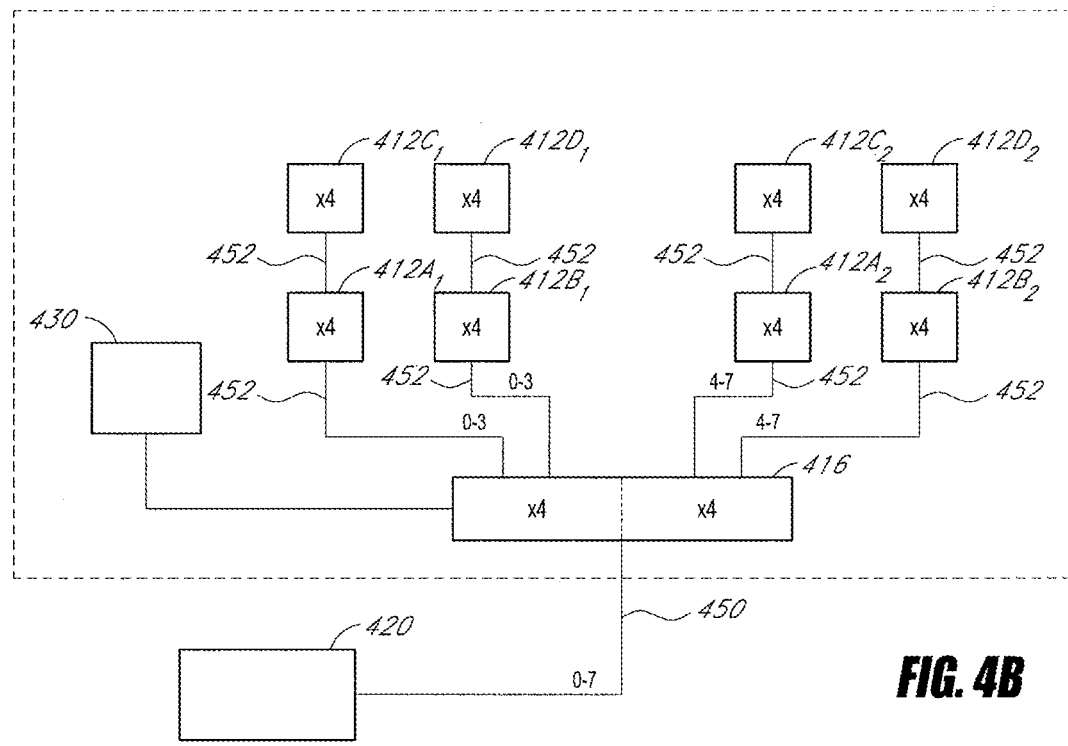
FIG. 4B schematically illustrates an example memory subsystem comprising a data transmission circuit with a bit width different from that as the individual memory devices.

In certain other embodiments, the bit widths of one or more of the memory devices 412 may be different from the bit widths of the one or more data transmission circuits 416 to which they are connected. For example, as schematically illustrated by FIG. 4B (which corresponds generally to FIG. 3B), the data transmission circuits 416 may have a first bit width (e.g., a bit width of 8 bits) and the memory devices 412 may have a second bit width which is less than the first bit width (e.g., one-half the first bit width, or a bit width of 4 bits), with each data transmission circuit 416 operatively coupled to multiple memory devices 412 per rank (e.g., two memory devices 412 in each rank). In certain such embodiments, the total bit width of the multiple memory devices 412 per rank connected to the circuit 416 equals the bit width of the circuit 416 (e.g., 4 bits, 8 bits, or 16 bits). The data transmission circuit 416 of FIG. 4B has a total bit width of 8 bits, and receives data bits 0-7 from the system memory controller 420 and selectively transmits data bits 0-3 to a first memory device $412A_1$, $412B_1$, $412C_1$, $412D_1$ and data bits 4-7 to a second memory device $412A_2$, $412B_2$, $412C_2$, $412D_2$ in response to the module control signals from the control circuit 430. Similarly, data transmission circuits 416' of certain embodiments can function with different bit widths than those of the associated memory devices $412'A_1$, $412'A_2$, $412'B_1$, $412'B_2$, $412'C_1$, $412'C_2$, $412'D_1$, $412'D_2$ to which the data transmission circuits 416' are operatively coupled in response to the module control signals from the control circuit 430'.

In certain embodiments, by having the data transmission circuit 416 comprise or serve as a "byte-wise" buffer (e.g., as shown in the examples of FIGS. 4A and 4B), the data signals are synchronous with the synch clock. In addition, for certain such embodiments in which the memory module 400 experiences variations in one or more characteristics (e.g., temperature, voltage, manufacturing parameters), the memory module 400 can be designed to optimize the circuits of a smaller number of components as compared to other configurations which do not utilize byte-wide buffering (e.g., having four ranks of 8-bit memory devices and having two 4-bit buffers). In certain embodiments, the data transmission circuits 416 are used for bit slicing in which the data are defined in sections. For example, rather than defining data to be 64-bit-wide (e.g., [63:0]), the data can be defined or sliced in 16-bit-wide sections (e.g., [15:0], [31:16], [47:32], [63:48]). In certain such embodiments, not all the bits are grouped together and not all the bits produce the same behavior (e.g., logic- and/or time-wise).

One or more of the data transmission circuits 416, in accordance with an embodiment of this disclosure, is operatively coupled to a corresponding one or more of the data lines 452 connected to one or more memory devices 412 in each of the ranks A, B, C, D. For example, in certain embodiments, each data transmission circuit 416 is connected to one or more data lines 452 connected to one corresponding memory device in each of the ranks (e.g., memory devices 204A, 204B, 204C, and 204D, as shown in FIG. 3A). Each data line 450, 452 thus carries data from the system memory controller 420, through the data transmission circuits 416, to the memory devices 204A, 204B, 204C, 204D connected to the data transmission circuits 416. The data transmission circuits 416 of certain embodiments may be used to drive each data bit to and from the memory controller 420 and the memory devices 412, instead of the memory controller 420 and the memory devices 412 directly driving each data bit to and from the memory controller 420 and the memory devices 412. Specifically, as described in more detail below, one side of each data transmission circuit 416 of certain embodiments is operatively coupled to a memory device 412 in each rank (e.g., via data lines 452), while the other side of the data transmission circuit 416 is operatively coupled to the corresponding data line 450 of the memory controller 420.

To reduce the memory device loads seen by the system memory controller 420 (e.g., during a write operation), the data transmission circuit 416 of certain embodiments is advantageously configured to be recognized by the system memory controller 420 as a single memory load. This advantageous result is desirably achieved in certain embodiments by using the data transmission circuits 416 to electrically couple only the enabled memory devices 412 to the memory controller 420 (e.g., the one, two, or more memory devices 412 to which data is to be written) and to electrically isolate the other memory devices 412 from the memory controller 420 (e.g., the one, two, or more memory devices 412 to which data is not to be written). Therefore, during a write operation in which data is to be written to a single memory device 412 in a rank of the memory module 400, each data bit from the system memory controller 420 sees a single load from the memory module 400, presented by one of the data transmission circuits 416, instead of concurrently seeing the loads of all of the four memory devices 412A, 412B, 412C, 412D to which the data transmission circuit 416 is operatively coupled. In the example of FIG. 3A, during a write operation in which data is to be written to two memory device 412 in two ranks (e.g., memory devices 412A and 412C or memory devices 412B and 412D), each data bit from the system memory controller 420 sees a single load from the memory module 402, which is presented by one of the data transmission circuits 416, instead of concurrently seeing the loads of all of the four memory devices 412A, 412B, 412C, 412D to which the data transmission circuits 416 is operatively coupled. In comparison to the standard JEDEC four-rank DEVINI configuration (see FIG. 2A and FIG. 2B), the memory system 402 of certain embodiments may reduce the load on the system memory controller 420 by a factor of four.

Figure 5:
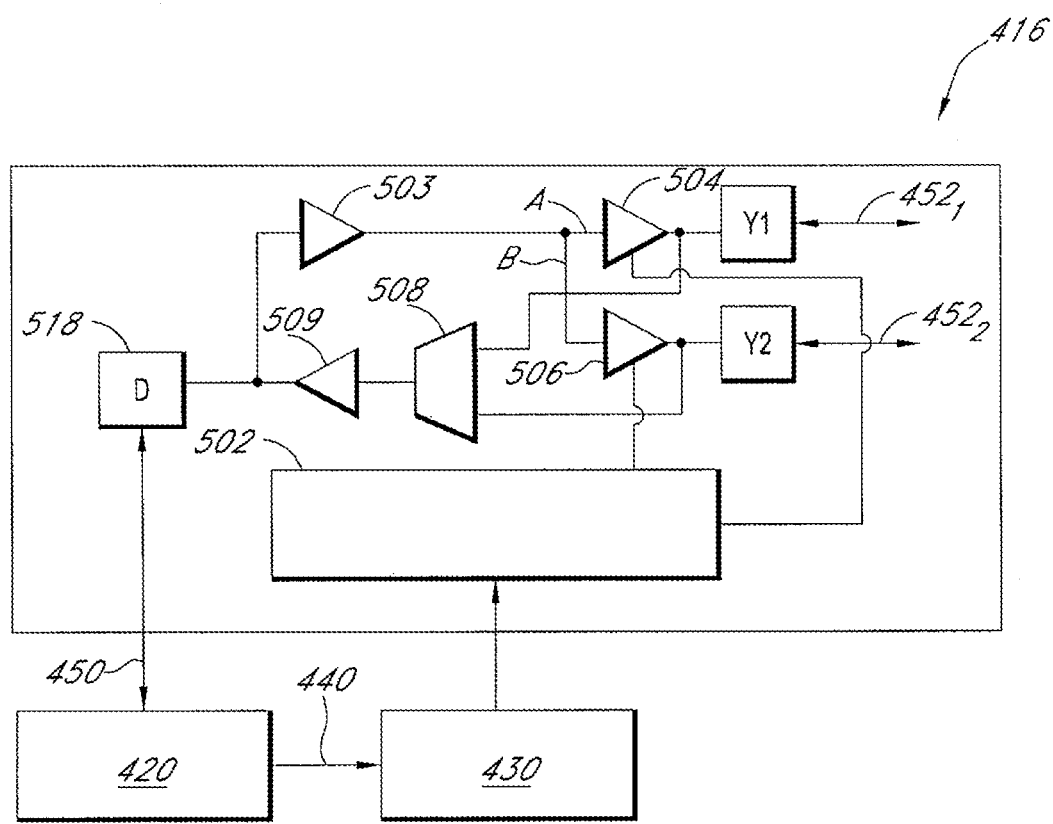
FIG. 5 is a schematic representation of an example embodiment of a data transmission circuit compatible with the memory subsystem of FIG. 3A.

FIG. 5 schematically illustrates an example data transmission circuit 416 compatible with certain embodiments described herein. In one embodiment, the data transmission circuits 416 includes control logic circuitry 502 used to control the various components of the data transmission circuit 416, which may include one or more buffers, one or more switches, and one or more multiplexers among other components. The illustrated embodiment of FIG. 5 is 1-bit wide and switches a single data line 518 between the memory controller 420 and the memory devices 412. In other embodiments, the data transmission circuit 416 may be multiple bits wide, for example, 8 bits, and switch a corresponding number of data lines 518. In a multiple bit wide embodiment, the control logic circuitry 502 may be shared over the multiple bits.

As a part of isolating the memory devices 412 from the system memory controller 420, in one embodiment, the data transmission circuits 416 allow for "driving" write data and "merging" read data. In the operational embodiment shown in FIG. 5, in a write operation, data entering a data transmission circuit 416 via a data line 518 is driven onto two data paths, labeled path A and path B, preferably after passing through a write buffer 503. The ranks of memory devices 412 are likewise divided into two groups with one group associated with path A and one group associated with path B. As shown in FIG. 3A, rank A and rank C are in the first group, and rank B and rank D are in the second group. Accordingly, the memory devices 412A, 412C of rank A and rank C are connected to the data transmission circuits 416 by a first one of the two data paths, and the memory devices 412B, 412D of rank B and rank D are connected to the data transmission circuits 416 by a second one of the two data paths. In other embodiments, the driving of write data and merging of read data may be performed over more than two data paths.

As is known, Column Address Strobe (CAS) latency is a delay time which elapses between the moment the memory controller 420 informs the memory modules 402 to access a particular column in a selected rank or row and the moment the data for or from the particular column is on the output pins of the selected rank or row. The latency may be used by the memory module to control operation of the data transmission circuits 416. During the latency, address and control signals pass from the memory controller 420 to the control circuit 430 which produces controls sent to the control logic circuitry 502 (e.g., via lines 432) which then controls operation of the components of the data transmission circuits 416.

For a write operation, during the CAS latency, the control circuit 430, in one embodiment, provides enable control signals to the control logic circuitry 502 of each data transmission circuit 416, whereby the control logic circuitry 502 selects either path A or path B to direct the data. Accordingly, when the control logic circuitry 502 receives, for example, an "enable A" signal, a first tristate buffer 504 in path A is enabled and actively drives the data value on its output, while a second tristate buffer 506 in path B is disabled with its output in a high impedance condition. In this state, the data transmission circuit 416 allows the data to be directed along path A to a first terminal Y1, which is connected to and communicates only with the first group of the memory devices 412, e.g., those in ranks A and C. Similarly, if an "enable B" signal is received, the first tristate 504 opens path A and the second tristate 506 closes path B, thus directing the data to a second terminal Y2, which is connected to and communicates only with the second group of the memory devices 412, e.g., those in ranks B and D.

For a read operation, the data transmission circuit 416 operates as a multiplexing circuit. In the illustrated embodiment of FIG. 5, for example, data signals read from the memory devices 412 of a rank are received at the first or second terminals Y1, Y2 of the data transmission circuit 416. The data signals are fed to a multiplexer 508, which selects one to route to its output. The control logic circuitry 502 generates a select signal to select the appropriate data signal, and the selected data signal is transmitted to the system memory controller 420 along a single data line 518, preferably after passing through a read buffer 509. The read buffer 509 may be a tristate buffer that is enabled by the control logic circuitry 502 during read operations. In another embodiment, the multiplexer 508 and the read buffer 509 may be combined in one component. In yet another embodiment, the multiplexer 508 and the read buffer 509 operations may be split over two tristate buffers, one to enable the value from Y1 to the data line 518 and another to enable the value from Y2 to the data line 518.

The data transmission circuits 416 present a load on the data lines 518 from the write buffer 503 and the read buffer 509. The write buffer 503 is comparable to an input buffer on one of the memory devices 412, and the read buffer 509 is comparable to an output buffer on one of the memory devices 412. Therefore, the data transmission circuits 416 present a load to the memory controller 420 that is substantially the same as the load that one of the memory devices 412 would present. Similarly, the data transmission circuits 416 present a load on the first and second terminals Y1, Y2 from the multiplexer 508 and the first tristate buffer 504 (on the first terminal Y1) and the second tristate buffer 506 (on the second terminal Y2). The multiplexer 508 is comparable in loading to an input buffer on the memory controller 420, and the first and second tristate buffers 504, 506 are each comparable to an output buffer on the memory controller 420. Therefore, the data transmission circuits 416 present a load to the memory devices 412 that is substantially the same as the load that the memory controller 420 would present.

Additionally, the data transmission circuits 416 operate to ameliorate quality of the data signals passing between the memory controller 420 and the memory devices 412. Without the data transmission circuits 416, waveforms of data signals may be substantially degraded or distorted from a desired shape between source and sink. For example, signal quality may be degraded by lossy transmission line characteristics, mismatch between characteristics of transmission line segments, signal crosstalk, or electrical noise. However, in the read direction, the read buffer 509 regenerates the signals from the memory devices 412 thereby restoring the desired signal waveform shapes. Similarly, in the write direction, the first tristate buffer 504 and the second tristate buffer 506 regenerate the signals from the memory controller 420 thereby restoring the desired signal waveform shapes.

Referring again to FIG. 3A, when the memory controller 420 executes read or write operations, each specific operation is targeted to a specific one of the ranks A, B, C, and D of a specific memory module 402. The data transmission circuit 416 on the specifically targeted one of the memory modules 402 functions as a bidirectional repeater/multiplexor, such that it drives the data signal when connecting from the system memory controller 420 to the memory devices 412. The other data transmission circuits 416 on the remaining memory modules 402 are disabled for the specific operation. For example, the data signal entering on data line 518 entering into data transmission circuit 416 is driven to memory devices 412A and 412C or 412B and 412C depending on which memory devices are active and enabled. The data transmission circuit 416 then multiplexes the signal from the memory devices 412A, 412B, 412C, 412D to the system memory controller 420. The data transmission circuits 416 may each control, for example, a nibble-wide data path or a bytewide-data path. As discussed above, the data transmission circuits 416 associated with each module 402 are operable to merge data read signals and to drive data write signals, enabling the proper data paths between the system memory controller 420 and the targeted or selected memory devices 412. Thus, the memory controller 420, when there are four four-rank memory modules, sees four load-reducing switching circuit loads, instead of sixteen memory device loads. The reduced load on the memory controller 420 enhances the performance and reduces the power requirements of the memory system, as compared with, for example, the conventional systems described above with reference to FIGS. 1A, 1B and 2A-2D.

Figure 6:
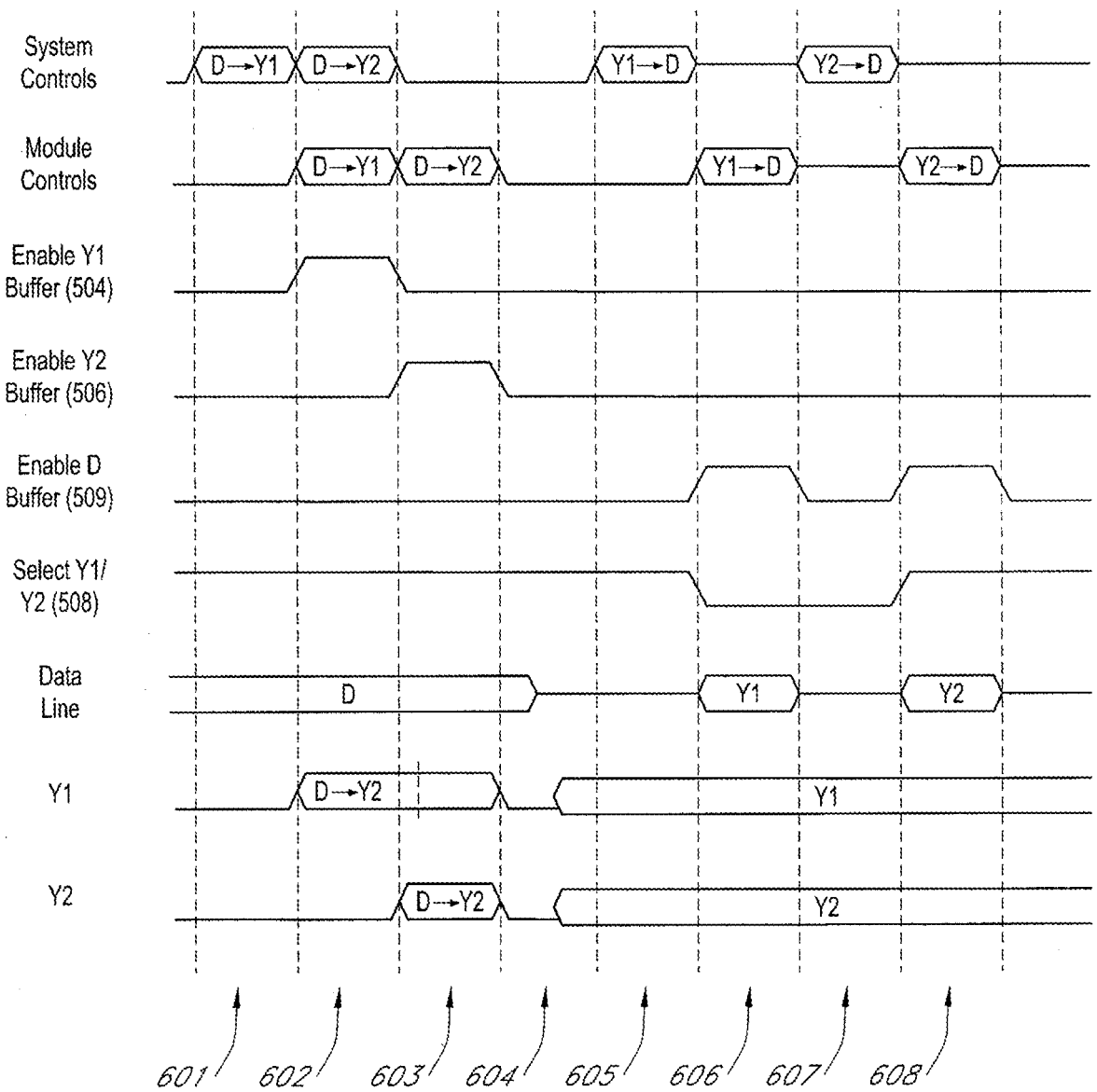
FIG. 6 is an example timing diagram illustrating operation of the memory system of FIGS. 3A and 5.

Operation of a memory module using the data transmission circuit 416 may be further understood with reference to FIG. 6, an illustrative timing diagram of signals of the memory module 402. The timing diagram includes first through eighth time periods 601-608. When the memory devices 404 are synchronous memories, each of the time periods 601-608 may correspond to one clock cycle of the memory devices 404.

The first, second, and third time periods 601-603 illustrate write operations with data passing from the memory controller 401 to the memory module 402. The fourth time period 604 is a transition between the write operations and subsequent read operations. The timing diagram shows a write operation to the first group of memory devices 412A, 412C connected to the first terminals Y1 of the data transmission circuits 416 and a write operation to the second group of memory devices 412B, 412D connected to the second terminals Y2 of the data transmission circuits 416. Recalling the CAS latency described above, each write operation extends over two time periods in a pipelined manner.

The write to the first group of memory devices 412A, 412C appears in the first time period 601 when system address and control signals 440 pass from the memory controller 420 to the module controller 430. The control circuit 430 evaluates the address and control signals 440 to determine that data is to be written to memory devices 412A, 412C in the first group. During the second time period 602, the control circuit 430 supplies control signals to the control logic circuitry 502 to enable the first tristate buffer 504 and to disable the second tristate buffer 506 and the read buffer 509. Thus, during the second time period 602, data bits pass from the data lines 518 to the first terminal Y1 and on to the memory devices 412A, 412C.

Similarly, the write to the second group of memory devices 412A, 412C appears in the second time period 602 when system address and control signals 440 pass from the memory controller 420 to the control circuit 430. The control circuit 430 evaluates the address and control signals 440 to determine that data is to be written to memory devices 412B, 412D in the second group. During the third time period 603, the control circuit 430 supplies control signals to the control logic circuitry 502 to enable the second tristate buffer 506 and to disable the first tristate buffer 504 and the read buffer 509. Thus, during the third time period 603, data bits pass from the data lines 518 to the second terminal Y2 and on to the memory devices 412B, 412D.

The fifth, sixth, seventh, and eighth time periods 605-608 illustrate read operations with data passing to the memory controller 420 from the memory module 402. The timing diagram shows a read operation from the first group of memory devices 412A, 412C connected to the first terminals Y1 of the data transmission circuits 416 and a read operation from the second group of memory devices 412B, 412D connected to the second terminals Y2 of the data transmission circuits 416. Recalling the CAS latency described above, each read operation extends over two time periods in a pipelined manner.

The read from the first group of memory devices 412A, 412C appears in the fifth time period 605 when system address and control signals 440 pass from the memory controller 420 to the control circuit 430. The control circuit 430 evaluates the address and control signals 440 to determine that data is to be read from memory devices 412A, 412C in the first group. During the sixth time period 606, the control circuit 430 supplies control signals to the control logic circuitry 502 to cause the multiplexer 58 to select data from the first terminal Y1, to enable the read buffer 509, and to disable the first tristate buffer 504 and the second tristate buffer 506. Thus, during the sixth time period 606, data bits pass from the memory devices 412A, 412C via the first terminal Y1 to data lines 518 and on to the memory controller 420.

The read from the second group of memory devices 412B, 412D appears in the seventh time period 607 when system address and control signals 440 pass from the memory controller 420 to the control circuit 430. The control circuit 430 evaluates the address and control signals 440 to determine that data is to be read from memory devices 412B, 412D in the second group. During the eighth time period 608, the control circuit 430 supplies control signals to the control logic circuitry 502 to cause the multiplexer 508 to select data from the second terminal Y2, to enable the read buffer 509, and to disable the first tristate buffer 504 and the second tristate buffer 506. Thus, during the eighth time period 606, data bits pass from the memory devices 412B, 412D via the second terminal Y2 to data lines 518 and on to the memory controller 420.

Various embodiments have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A N-bit-wide memory module mountable in a memory socket of a computer system and configurable to communicate with a memory controller of the computer system via address and control signal lines and N-bit wide data signal lines, the N-bit wide data signal lines including a plurality of sets of data signal lines, each set of data signal lines is a byte wide, the memory module comprising:

a printed circuit board (PCB) having an edge connector comprising a plurality of electrical contacts which are positioned on an edge of the PCB and configured to be releasably coupled to corresponding contacts of the memory socket;

double data rate dynamic random access memory (DDR DRAM) devices coupled to the PCB and arranged in multiple N-bit-wide ranks;

a module controller coupled to the PCB and operatively coupled to the DDR DRAM devices, wherein the module controller is configurable to receive from the memory controller via the address and control signal lines input address and control signals for a memory write operation to write N-bit-wide write data from the memory controller into a first N-bit-wide rank of the multiple N-bit-wide ranks, and to output registered address and control signals in response to receiving the input address and control signals, wherein the registered address and control signals cause the first N-bit-wide rank to perform the memory write operation by receiving the N-bit-wide write data, wherein the module controller is further configurable to output module control signals in response to at least some of the input address and control signals; and a plurality of byte-wise buffers coupled to the PCB and configured to receive the module control signals, wherein each respective byte-wise buffer of the plurality of byte-wise buffers has a first side configured to be operatively coupled to a respective set of data signal lines, a second side that is operatively coupled to at least one respective DDR DRAM device in each of the multiple N-bit-wide ranks via respective module data lines, and a byte-wise data path between the first side and the second side, wherein the each respective byte-wise buffer is disposed on the PCB at a respective position corresponding to the respective set of the plurality of sets of data signal lines;

wherein the each respective byte-wise buffer further includes logic configurable to control the byte-wise data path in response to the module control signals, wherein the byte-wise data path is enabled for a first time period in accordance with a latency parameter to actively drive a respective byte-wise section of the N-bit wide write data associated with the memory operation from the first side to the second side during the first time period; and wherein the byte-wise data path includes first tristate buffers, and the logic in response to the module control signals is configured to enable the first tristate buffers to drive the respective byte-wise section of the N-bit wide write data to the respective module data lines during the first time period.

2. The memory module of claim 1, wherein the DDR DRAM devices each has a bit width of 4 bits, wherein the at least one respective DDR DRAM device in each of the multiple N-bit-wide ranks includes a respective pair of DDR DRAM devices, and wherein a first subset of the first tristate buffers is enabled for the first time period to drive a first nibble of the respective byte-wise section of the N-bit wide write data to a first subset of the respective module data lines coupled to a first one of the respective pair of DDR DRAM devices in each of at least some of the multiple N-bit-wide ranks, while a second subset of the first tristate buffers is enabled for the first time period to drive a second nibble of the respective byte-wise section of the N-bit wide write data to a second subset of the respective module data lines coupled to a second one of the respective pair of DDR DRAM devices in each of at least some of the multiple N-bit-wide ranks.

3. The memory module of claim 2, wherein the byte-wise data path further includes a set of write buffers configurable to receive the respective byte-wise section of the N-bit wide write data from the respective set of data signal lines before the first tristate buffers regenerate and drive the respective byte-wise section of the N-bit wide data to the second side of the each respective byte-wise buffer.

4. The memory module of claim 3, wherein each of the write buffers is comparable to an input buffer on one of the DDR DRAM devices such that the each respective byte-wise buffer presents to the memory controller one DDR DRAM device load during the memory operation.

5. The memory module of claim 1, wherein the DDR DRAM devices each has a bit width of 8 bits, and wherein the at least one respective DDR DRAM device in each of the multiple N-bit-wide ranks includes a single DDR DRAM device.

6. The memory module of claim 1, wherein the logic is configurable to enable the first tristate buffers at a beginning of the first time period and to disable the first tristate buffers at an end of first time period.

7. The memory module of claim 1, wherein the module controller is configured to use the module control signals to control timing of the first time period in accordance with the latency parameter.

8. The memory module of claim 1, wherein the registered address and control signals include rank select signals, the rank select signals including one rank select signal for each of the multiple N-bit-wide ranks, and wherein the rank select signal received by the first N-bit-wide rank is different from the rank select signal received by any other N-bit-wide rank of the multiple N-bit-wide ranks.

9. The memory module of claim 8, wherein each of the respective module data lines is configured to carry data from the memory controller to a corresponding memory device in each of the multiple N-bit-wide ranks during the memory write operation.

10. The memory module of claim 1, wherein:

the module controller is further configurable to receive from the memory controller via the address and control signal lines additional input address and control signals for a memory read operation to read N-bit-wide read data from the memory controller from a second N-bit-wide rank of the multiple N-bit-wide ranks, and to output additional registered address and control signals in response to the additional input address and control signals;

the second N bit-wide rank is configurable to output the N bit-wide read data associated with the memory read operation in response to at least some of the additional registered address and control signals;

the module controller is further configurable to output additional module control signals in response to the additional input address and control signals;

the logic in the each respective byte-wise buffer is further configurable to control the byte-wise data path in response to the additional module control signals, wherein the byte-wise data path is enabled for a second time period to actively drive a respective byte-wise section of the N bit wide read data associated with the memory read operation from the second side to the first side during the second time period in response to the additional module control signals;

the byte-wise data path further includes second tristate buffers configurable to be enabled by the logic to drive the respective byte-wise section of the N-bit wide read data to the respective set of data signal lines during the second time period; and the second tristate buffers are disabled during the first time period and the first tristate buffers are disabled during the second time period.

11. A N-bit-wide memory module mountable in a memory socket of a computer system and configured to communicate with a memory controller of the computer system via address and control signal lines and N-bit wide data signal lines, the N-bit wide data signal lines including a plurality of sets of data signal lines, the memory module comprising:

a printed circuit board (PCB) having an edge connector comprising a plurality of electrical contacts which are positioned on an edge of the PCB and are configured to be releasably coupled to corresponding contacts of the memory socket;

double data rate dynamic random access memory (DDR DRAM) devices coupled to the PCB and arranged in multiple N-bit-wide ranks, each N-bit-wide rank includes n DDR DRAM devices;

n/2 data transmission circuits mounted on the PCB, wherein each of the n/2 data transmission circuits is disposed on the PCB at respective positions corresponding to a respective set of data signal lines among the plurality of sets of data signal lines, and wherein the each of the n/2 data transmission circuits has a first side configured to be operatively coupled to the respective set of data signal lines, a second side that is operatively coupled to a respective pair of DDR DRAM devices in each of the multiple ranks via respective module data lines, and data paths between the first side and the second side;

a module controller coupled to the PCB and operatively coupled to the DDR DRAM devices, the module controller being configurable to receive from the memory controller via the address and control signal lines input address and control signals for a memory write operation to write N-bit-wide write data from the memory controller into a first N-bit-wide rank among the multiple N-bit-wide ranks, and to output registered address and control signals in response to the input address and control signal, wherein the registered address and control signals cause the first N-bit-wide rank to perform the memory write operation by receiving the N-bit-wide write data, wherein the module controller is further configurable to transmit module control signals to the n/2 data transmission circuits in response to the input address and control signals; and wherein, in response to the module control signals, each respective data transmission circuit is configurable to enable the data paths for a first time period in accordance with a latency parameter to actively drive a respective section of the N-bit wide write data associated with the memory operation from the first side to the second side during the first time period, wherein a first subsection of the respective section of the N-bit wide write data output from the second side of the each respective data transmission circuit is written into a first one of the respective pair of DDR DRAM devices in the first N-bit wide rank, while a second subsection of the respective section of the N-bit wide write data output from the second side of the each respective data transmission circuit is written into a second one of the respective pair of DDR DRAM devices in the first N-bit wide rank; and wherein the data paths includes first tristate buffers, and the respective data transmission circuit in response to the module control signals is configured to enable a first subset of the first tristate buffers to drive the first subsection of the respective section of the N-bit wide write data to a first subset of the respective module data lines coupled to a first one of the respective pair of DDR DRAM devices in each of at least some of the multiple N-bit-wide ranks, and to enable a second subset of the first tristate buffers to drive a second subsection of the respective section of the N-bit wide write data to a second subset of the respective module data lines coupled to a second one of the respective pair of DDR DRAM devices in each of at least some of the multiple N-bit-wide ranks.

12. The memory module of claim 11, wherein the registered address and control signals include a rank select signal for each of the multiple N-bit wide ranks, the rank select signal for the first N-bit wide rank is different from the rank select signal for any other N-bit wide rank of the multiple N-bit wide ranks.

13. The memory module of claim 12, wherein each of the respective module data lines is configured to carry data from the memory controller to a corresponding memory device in each of the multiple N-bit-wide ranks during the memory operation.

14. The memory module of claim 13, wherein the data paths further include a set of write buffers configurable to receive the respective section of the N-bit wide data from the respective set of data signal lines before the respective section of the N-bit wide write data is regenerated and driven by—the first tristate buffers to the respective module data lines.

15. The memory module of claim 14, wherein each of the set of write buffers is comparable in loading to an input buffer on one of the DDR DRAM devices such that the each respective data transmission circuit presents to the memory controller one DDR DRAM device load during the memory write operation.

16. The memory module of claim 11, wherein the module controller is configurable to use the module control signals to control timing of the first time period in accordance with the latency parameter.

17. The memory module of claim 11, wherein the each respective data transmission circuit is configured to present to the memory controller one DDR DRAM device load on each of the respective set of data lines during the memory write operation.

18. The memory module of claim 11, wherein:

the module controller is further configurable to receive from the memory controller via the address and control signal lines additional input address and control signals for a subsequent memory read operation to read N bit-wick: read data from a second N-bit-wide rank of the multiple N-bit-wide ranks, and to output additional registered address and control signals in response to the additional input address and control signals;

the second N-bit-wide rank of the multiple N-bit-wide ranks is configurable to output the N-bit-wide read data associated with the memory read operation in response to at least some of the additional registered address and control signals;

the module controller is further configurable to output additional module control signals in response to the additional input address and control signals; and the each respective data transmission circuit is further configurable to enable the data paths for a second time period to actively drive a respective section of the N-bit wide read data associated with the memory read operation from the second side to the first side during the second time period in response to the additional module control signals;

the data paths further includes second tristate buffers configurable to be enabled during the second time period to drive the respective section of the N-bit wide read data to the respective set of data signal lines; and the each respective data transmission circuit is further configurable to keep the second tristate buffers disabled during the first time period and to keep the first tristate buffers disabled during the second time period.

19. A N-bit-wide memory module mountable in a memory socket of a computer system and configured to communicate with a memory controller of the computer system via address and control signal lines and N-bit wide data signal lines, the N-bit wide data signal lines including a plurality of sets of data signal lines, the memory module comprising:

a printed circuit board (PCB) having an edge connector comprising a plurality of electrical contacts which are positioned on an edge of the PCB and are configured to be releasably coupled to corresponding contacts of the memory socket;

double data rate dynamic random access memory (DDR DRAM) devices coupled to the PCB and arranged in multiple N-bit-wide ranks;

a module controller coupled to the PCB and operatively coupled to the DDR DRAM devices, the module controller being configurable to receive from the memory controller via the address and control signal lines first address and control signals for a first memory operation to read first N-bit-wide data from a first N-bit-wide rank among the multiple ranks and to subsequently receive second address and control signals for a second memory operation to read second N-bit-wide data from a second N-bit-wide rank among the multiple ranks, the module controller being further configurable to output first registered address and control signals for the first memory operation in response to receiving the first address and control signals and to output second registered address and control signals for the second memory operation in response to receiving the second address and control signals, wherein the first registered address and control signals cause the first N-bit-wide rank to output the first N-bit-wide data associated with the first memory operation, and the second registered address and control signals cause the second N-bit-wide rank to output the second N-bit-wide data associated with the second memory operation, wherein the module controller is further configurable to output first module control signals for the first memory operation in response to receiving the first address and control signals and to output second module control signals for the second memory operation in response to receiving the second address and control signals; and a plurality of buffers coupled to the PCB and configured to receive the first module control signals and to receive the second module control signals, wherein each respective buffer of the plurality of buffers has a first side that is operatively coupled to a respective set of data signal lines, a second side that is operatively coupled to at least one respective DDR DRAM device in each of the multiple N-bit-wide ranks via respective module data lines, and data paths between the first side and the second-side, wherein the each respective buffer is disposed on the PCB at a respective position corresponding to the respective set of the plurality of sets of data signal lines;

wherein the each respective buffer further includes logic configurable to enable the data paths for a first time period to actively drive a respective section of the first N-bit wide data associated with the first memory operation from the second side to the first side during the first time period, and to enable the data paths for a second time period subsequent to the first time period to actively drive a respective section of the second N-bit wide data associated with the second memory operation from the second side to the first side during the second time period, wherein the data paths are disabled after the first time period and before the second time period.

20. The memory module of claim 19, wherein the DDR DRAM devices each has a bit width of 4 bits, wherein the at least one respective DDR DRAM device in each of the multiple N-bit-wide ranks includes a respective pair of DDR DRAM devices, and wherein a first nibble of the respective section of the first N bit wide data is output by a first one of the respective pair of DDR DRAM devices in the first N-bit wide rank, while a second nibble of the respective section of the first N bit wide data is output by a second one of the respective pair of DDR DRAM devices in the first N-bit wide rank.

21. The memory module of claim 19, wherein the module controller is configured to use the first module control signals to control timing of the first time period in accordance with a latency parameter and to use the second module control signals to control timing of the second time period in accordance with the latency parameter.

22. The memory module of claim 19, wherein the each respective buffer is configured to present to the at least one respective DDR DRAM device a load that is similar to that of the memory controller during the first or the second memory operation.

23. The memory module of claim 19, wherein the first registered address and control signals include a first set of rank select signals corresponding to respective ones of the multiple N-bit wide ranks, the first set of rank select signals including a first rank select signal received by the first N-bit wide rank that is different from each of the other rank select signals in the first set of rank select signals, and wherein the second registered address and control signals include a second set of rank select signals corresponding to respective ones of the multiple N-bit wide ranks, the second set of rank select signals including a second rank select signal received by the second N-bit wide rank that is different from each of the other rank select signals in the second set of rank select signals.

24. The memory module of claim 23, wherein each of the respective module data lines is configured to carry data from the memory controller to a corresponding memory device in each of the multiple N-bit-wide ranks.

25. The memory module of claim 19, wherein the data path includes at least a first input buffer and a second buffer for each bit of the respective section of the first or second N-bit wide data, wherein the first buffer is configured to receive the each bit from the second side of the each respective buffer, and the second buffer is configured to regenerate and drive the each bit to the first side of the each respective buffer, wherein at least the second buffer is a tristate buffer configurable to be enabled by the logic in response to the first or second module control signals, and wherein the first buffer is comparable to an output buffer on one of the DDR DRAM devices.

26. The memory module of claim 19, wherein the data paths include a set of input buffers configurable to receive the respective section of the first or second N-bit wide data from the respective set of module data lines and a set of output buffers configurable to regenerate and drive the respective section of the first or second N-bit wide data to the first side, wherein at least the set of output buffers are tristate buffers configurable to be enabled by the logic during the first time period in response to the first module control signals and during the second time period in response to the second module control signals, and wherein at least the set of output buffers are disabled by the logic after the first time period and before the second time period.

27. A memory module mountable in a memory socket of a computer system and configurable to communicate with a memory controller of the computer system via address and control signal lines and data signal lines, the data signal lines including a plurality of sets of data signal lines, each set of data signal lines is n bit wide, the memory module comprising:
   a printed circuit board (PCB) having an edge connector comprising a plurality of electrical contacts which are positioned on an edge of the PCB and are configured to be releasably coupled to corresponding contacts of the memory socket;
   a module controller coupled to the PCB and configurable to receive from the memory controller via the address and control signal lines first address and control signals for a memory write operation and to subsequently receive second address and control signals for a memory read operation, the module controller being further configurable to output first registered address and control signals and first module control signals for the memory write operation in response to the first address and control signals, and to output second registered address and control signals and second module control signals for the memory read operation in response to the second address and control signals; and
   double data rate dynamic random access memory (DDR DRAM) devices coupled to the PCB and configurable to perform the memory write operation by receiving write data in response to the first registered address and control signals, and to perform the memory read operation by outputting read data in response to the second registered address and control signals; and
   a plurality of n-bit-wide data buffers coupled to the PCB and configured to receive the first module control signals and subsequently the second module control signals, wherein each respective n-bit-wide data buffer of the plurality of n-bit-wide data buffers has a first side that is operatively coupled to a respective set of data signal lines, and a second side that is operatively coupled to a respective n-bit-wide section of the DDR DRAM devices via respective module data lines, wherein:
   the each respective n-bit-wide data buffer includes a first set of input buffers configurable to receive a respective n-bit section of the write data from the respective set of data signal lines, a first set of tristate buffers configurable to drive the respective n-bit section of the write data to the respective module data lines, a second set of input buffers configurable to receive a respective n-bit section of the read data from the respective module data lines, a second set of tristate buffers configurable to drive the respective n-bit section of the read data to the respective set of data signal lines, and logic configurable to control at least the first set of tristate buffers and the second set of tristate buffers;
   the logic in response to the first module control signals is configured to enable the first set of tristate buffers for a first time period corresponding to the memory write operation to drive the respective n-bit section of the write data;
   the logic in response to the second module control signals is configured to enable the second set of tristate buffers for a second time period corresponding to the memory read operation to drive the respective n-bit section of the read data;
   the first set of tristate buffers are disabled during the second time period; and
   the second set of tristate buffers are disabled during the first time period.

28. The memory module of claim 27, wherein the logic is configurable to keep the first set of tristate buffers and the second set of tristate buffers disabled when the memory module is not targeted by the memory controller for any memory operations.

29. The memory module of claim 27, wherein:
   the DDR DRAM devices include a plurality of ranks of DDR DRAM devices;
   the each respective n-bit-wide buffer is coupled to at least one respective DDR DRAM device in each of the plurality of ranks via the respective module data lines;
   the first registered address and control signals cause one rank of DDR DRAM devices to perform the memory write operation by receiving the write data; and
   the second registered address and control signals cause one rank of DDR DRAM devices to perform the memory read operation by outputting the read data.

30. The memory module of claim 29, wherein:
   the at least one respective DDR DRAM device in each of the plurality of ranks includes a respective pair of DDR DRAM devices;
   a first n/2-bit section of the respective n-bit section of the write_data is driven by a first subset of the first set of tristate buffers to a first one of the respective pair of DDR DRAM devices in the one rank of DDR DRAM devices performing the memory write operation;
   a second n/2-bit section of the respective n-bit section of the write_data is driven by a second subset of the first set of tristate buffers to a second one of the respective pair of DDR DRAM devices in the one rank of DDR DRAM devices performing the memory write operation;
   a first n/2-bit section of the respective n-bit section of the read_data is received by a first subset of the second set of input buffers from a first one of the respective pair of DDR DRAM devices in the one rank of DDR DRAM devices performing the memory read operation; and a second n/2-bit section of the respective n-bit section of the read_data is received by a second subset of the second set of input buffers from the second one of the respective pair of DDR DRAM devices in the one rank of DDR DRAM devices performing the memory read operation.

31. The memory module of claim 29, wherein:
the at least one respective DDR DRAM device in each of the plurality of ranks includes one respective DDR DRAM;
the respective n-bit section of the write_data is driven by the first set of tristate buffers to the respective DDR DRAM device in the one rank of DDR DRAM devices performing the memory write operation; and
the respective n-bit section of the read_data is received by the second set of input buffers from the respective DDR DRAM device in the one rank of DDR DRAM devices performing the memory read operation.

32. The memory module of claim 29, wherein each of the respective module data lines is configured to carry data from the memory controller to a corresponding memory device in each of the plurality of ranks.

33. The memory module of claim 29, wherein:
the module controller is further configurable to receive from the memory controller via the address and control signal lines third address and control signals for a subsequent memory read operation, and to output third registered address and control signals and third module control signals for the subsequent memory read operation in response to receiving the third address and control signals;
the DDR DRAM devices are configurable to perform the subsequent memory read operation by outputting additional read data in response to the third registered address and control signals;
the subsequent memory read operation is performed by another rank of DDR DRAM devices that is different from the one rank of DDR DRAM devices performing the memory read operation;
the logic in response to the third module control signals enables the second set of tristate buffers for a third time period corresponding to the subsequent memory read operation to drive a respective n-bit section of the additional read data; and
the logic is further configurable to disable the second set of tristate buffers after the second time period and before the third time period.

34. The memory module of claim 27, wherein the first set of tristate buffers are enabled for the first time period in accordance with a latency parameter.

35. The memory module of claim 27, wherein the second set of tristate buffers are enabled for the second time period in accordance with a latency parameter.

* * * * *